(12) United States Patent
Oh et al.

(10) Patent No.: US 11,194,395 B2
(45) Date of Patent: Dec. 7, 2021

(54) DISPLAY DEVICE AND METHOD OF DRIVING THE SAME

(71) Applicant: Samsung Display Co., Ltd., Yongin-si (KR)

(72) Inventors: Joon Hak Oh, Seongnam-si (KR); Jae Been Lee, Seoul (KR); Byeong Hee Won, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 69 days.

(21) Appl. No.: 16/688,837

(22) Filed: Nov. 19, 2019

(65) Prior Publication Data

US 2020/0241642 A1 Jul. 30, 2020

(30) Foreign Application Priority Data

Jan. 30, 2019 (KR) .......................... 10-2019-0012279

(51) Int. Cl.
| | |
|---|---|
| *G06F 3/01* | (2006.01) |
| *H01L 41/113* | (2006.01) |
| *H01L 41/193* | (2006.01) |
| *H01L 41/047* | (2006.01) |
| *H01L 27/32* | (2006.01) |
| *G06F 3/041* | (2006.01) |
| *G06F 3/044* | (2006.01) |
| *H01L 27/20* | (2006.01) |

(52) U.S. Cl.
CPC .............. *G06F 3/016* (2013.01); *G06F 3/044* (2013.01); *G06F 3/04182* (2019.05); *H01L 27/20* (2013.01); *H01L 27/323* (2013.01); *H01L 41/047* (2013.01); *H01L 41/1132* (2013.01); *H01L 41/193* (2013.01); *G06F 2203/04105* (2013.01)

(58) Field of Classification Search
CPC ...... G06F 3/016; G06F 3/04182; G06F 3/044; G06F 2203/04105; H01L 27/20; H01L 27/323; H01L 41/047; H01L 41/1132; H01L 41/193
See application file for complete search history.

(56) References Cited

U.S. PATENT DOCUMENTS

| | | | |
|---|---|---|---|
| 2013/0222267 A1* | 8/2013 | Almalki | G06F 3/04164 345/173 |
| 2015/0097794 A1 | 4/2015 | Lisseman et al. | |
| 2017/0097718 A1* | 4/2017 | Oh | G06F 3/04144 |
| 2017/0220112 A1 | 8/2017 | Nakamura et al. | |
| 2018/0186304 A1 | 7/2018 | Wachinger | |
| 2018/0203511 A1 | 7/2018 | Lisseman et al. | |
| 2018/0219990 A1 | 8/2018 | Yliaho et al. | |
| 2020/0059713 A1* | 2/2020 | Noh | H04R 1/028 |
| 2020/0233629 A1* | 7/2020 | Yeon | G06F 1/1605 |

FOREIGN PATENT DOCUMENTS

KR 10-2012-0006619 A 1/2012

* cited by examiner

*Primary Examiner* — Michael Pervan
(74) *Attorney, Agent, or Firm* — Lewis Roca Rothgerber Christie LLP

(57) ABSTRACT

A display device includes a display panel, and a plurality of piezoelectric elements arranged on one surface of the display panel, wherein each of the plurality of piezoelectric elements includes a pressure sensor configured to detect pressure applied to a surface opposite to the one surface of the display panel, and a haptic device configured to generate vibration according to a driving voltage.

19 Claims, 26 Drawing Sheets

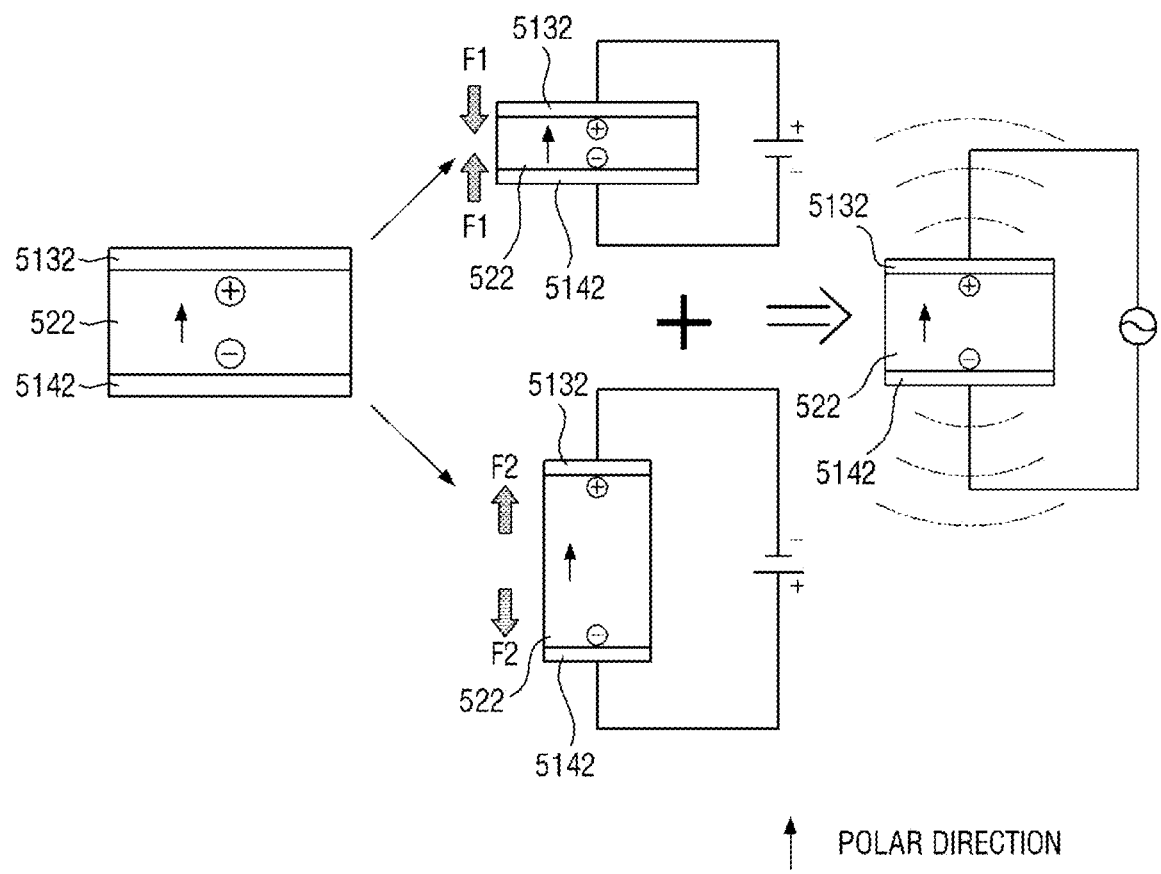

DISPLAY DEVICE AND METHOD OF DRIVING THE SAME

CROSS-REFERENCE TO RELATED APPLICATION

This application claims priority from and the benefit of Korean Patent Application No. 10-2019-0012279, filed on Jan. 30, 2019, which is hereby incorporated by reference for all purposes as if fully set forth herein.

BACKGROUND

1. Field

Aspects of the disclosure relate to a display device and a method of driving the same.

2. Description of the Related Art

A display device refers to a device for displaying an image and includes a display member such as an organic light-emitting diode (OLED) member or a liquid crystal display (LCD) member. The display member may include a display layer having a plurality of pixels and a touch sensing layer for implementing a touch sensing function.

The display device has been developed to provide users with various physical user interfaces (UI) based on a visual sense, an auditory sense, a tactile sense, and the like as a feedback to a touch. Among them, a tactile feedback, that is, a haptic feedback, refers to a method of exerting physical force on a user based on an event or interaction that occurs under various graphic environments and makes a user feel a haptic sensation with vibration applied when the display device detects a touch.

However, a touch sensor and a haptic device additionally provided in the display device may increase the weight and size of the display device. Accordingly, there is a need of maintaining a slim display device even though the touch sensing and the haptic feedback are actualized in the display device.

SUMMARY

Aspects of some embodiments of the present disclosure are directed to a slim display device in which touch sensing and haptic feedback functions are integrated.

Aspects of some embodiments of the present disclosure are also directed to a reliable display device in which strength of a haptic feedback is uniform throughout.

According to some embodiments of the present disclosure, there is provided a display device including: a display panel; and a plurality of piezoelectric elements arranged on one surface of the display panel, wherein each of the plurality of piezoelectric elements includes: a pressure sensor configured to detect pressure applied to a surface opposite to the one surface of the display panel; and a haptic device configured to generate vibration according to a driving voltage.

In some embodiments, the pressure sensor is on the one surface of the display panel, and the haptic device is on the pressure sensor.

In some embodiments, the pressure sensor is thinner than the haptic device.

In some embodiments, the pressure sensor includes a first electrode, a second electrode, and a first piezoelectric polymer layer between the first electrode and the second electrode; and the haptic device includes a third electrode, a fourth electrode, and a second piezoelectric polymer layer between the third electrode and the fourth electrode.

In some embodiments, the first electrode includes a first stem electrode and first branch electrodes branched out from the first stem electrode; and the second electrode includes a second stem electrode and second branch electrodes branched out from the second stem electrode.

In some embodiments, the first branch electrodes and the second branch electrodes are arranged in parallel and alternately arranged in a direction.

In some embodiments, the third electrode includes a third stem electrode and third branch electrodes branched out from the third stem electrode; and the fourth electrode includes a fourth stem electrode and fourth branch electrodes branched out from the fourth stem electrode.

In some embodiments, a number of the first branch electrodes or a number of the second branch electrodes is less than a number of the third branch electrodes or a number of the fourth branch electrodes.

In some embodiments, the display device further includes a plurality of piezoelectric element drivers configured to detect voltages generated in the first and second electrodes of the pressure sensor according to the pressure applied to the surface opposite to the one surface of the display panel.

In some embodiments, the plurality of piezoelectric element drivers are configured to apply the driving voltage to the third and fourth electrodes of the haptic device to make the haptic device vibrate.

In some embodiments, the display device further includes a main processor configured to obtain a plurality of sensing voltages detected by the first and second electrodes of pressure sensors from the plurality of piezoelectric element drivers, to identify a piezoelectric element to be driven among the plurality of piezoelectric elements based on a comparison between the plurality of sensing voltages and a driving voltage for haptic-target vibration, and to identify the driving voltage for each of the piezoelectric elements to be driven.

In some embodiments, the main processor is configured to: compare a magnitude of vibration from a first piezoelectric element having a highest sensing voltage among the plurality of piezoelectric elements with a magnitude of the haptic-target vibration and identify the first piezoelectric element as the piezoelectric element to be driven when the magnitude of the haptic-target vibration is lower than the magnitude of the vibration from the first piezoelectric element; compare a magnitude of a sum of vibration from a second piezoelectric element having a next highest sensing voltage after the highest sensing voltage of the first piezoelectric element among the plurality of piezoelectric elements and the vibration from the first piezoelectric element with the magnitude of the haptic-target vibration when the magnitude of the vibration from the first piezoelectric element is lower than the magnitude of the haptic-target vibration; and identify the first piezoelectric element and the second piezoelectric element as the piezoelectric elements to be driven when the magnitude of the haptic-target vibration is lower than the magnitude of the sum of the vibration from the first piezoelectric element and the vibration from the second piezoelectric element.

In some embodiments, the main processor is configured to: when only the first piezoelectric element is driven, identify the driving voltage for the first piezoelectric element based on a first value resulting from multiplying a second value by a maximum driving voltage for the plurality of piezoelectric elements, the second value being a result of dividing the magnitude of the haptic-target vibration by the magnitude of the vibration from the first piezoelectric element; and when the first piezoelectric element and the second piezoelectric element are driven, identify the maximum driving voltage as the driving voltage for the first piezoelectric element and identify a third value, resulting from multiplying a fourth value by the maximum driving voltage for the piezoelectric element, as the driving voltage for the second piezoelectric element, the fourth value being a result of dividing a fifth value by the magnitude of the vibration from the second piezoelectric element, the fifth value being a result of subtracting the magnitude of the vibration from the first piezoelectric element from the magnitude of the haptic-target vibration.

According to some embodiments of the present disclosure, there is provided a method of driving a display device, the method including: obtaining a sensing voltage from a plurality of piezoelectric elements; detecting a touch point based on the sensing voltage; loading a magnitude of vibration from each of the plurality of piezoelectric elements, the magnitude of the vibration from each of the plurality of piezoelectric elements being detectable at the touch point; comparing a magnitude of haptic-target vibration with the magnitude of the vibration from each of the plurality of piezoelectric elements; identifying a piezoelectric element to be driven among the plurality of piezoelectric elements, and identifying a driving voltage for the piezoelectric element to be driven; and generating the haptic-target vibration based on the driving voltage.

In some embodiments, the identifying of a piezoelectric element to be driven among the plurality of piezoelectric elements includes: comparing a magnitude of vibration from a first piezoelectric element having a highest sensing voltage among the plurality of piezoelectric elements with a magnitude of the haptic-target vibration and identifying the first piezoelectric element as the piezoelectric element to be driven when the magnitude of the haptic-target vibration is lower than the magnitude of the vibration from the first piezoelectric element; comparing a magnitude of a sum of vibration from a second piezoelectric element having a next highest sensing voltage after the sensing voltage of the first piezoelectric element among the plurality of piezoelectric elements and the vibration from the first piezoelectric element with the magnitude of the haptic-target vibration when the magnitude of the vibration from the first piezoelectric element is lower than the magnitude of the haptic-target vibration; and identifying the first piezoelectric element and the second piezoelectric element as the piezoelectric elements to be driven when the magnitude of the haptic-target vibration is lower than the magnitude of the sum of the vibration from the first piezoelectric element and the vibration from the second piezoelectric element.

In some embodiments, the identifying of a driving voltage for each piezoelectric element to be driven includes: when only the first piezoelectric element is driven, identifying the driving voltage for the first piezoelectric element based on a first value resulting from multiplying a second value by a maximum driving voltage for the plurality of piezoelectric elements, the second value being a result of dividing the magnitude of the haptic-target vibration by the magnitude of the vibration from the first piezoelectric element; and when the first piezoelectric element and the second piezoelectric element are driven, identifying the maximum driving voltage as the driving voltage for the first piezoelectric element and identifying a third value resulting from multiplying a fourth value by the maximum driving voltage for the piezoelectric element as the driving voltage for the second piezoelectric element, the fourth value being a result of dividing a fifth value by the magnitude of the vibration from the second piezoelectric element, the fifth value being a result of subtracting the magnitude of the vibration from the first piezoelectric element from the magnitude of the haptic-target vibration.

In some embodiments, the method further includes removing noise caused by the haptic-target vibration.

In some embodiments, the removing of the noise caused by the haptic-target vibration includes making a first piezoelectric element that is not driven among the plurality of piezoelectric elements generate a second vibration having an inverse phase to a first vibration of a noise component generated by a second piezoelectric element that is driven among the plurality of piezoelectric elements.

According to some embodiments of the present disclosure, there is provided a method of driving a display device, the method including: obtaining a sensing voltage from a plurality of piezoelectric elements; detecting a touch point based on the sensing voltage; loading a magnitude of vibration from each of the plurality of piezoelectric elements detectable at the touch point when a highest driving voltage is applied to the plurality of piezoelectric elements; identifying a driving voltage for the plurality of piezoelectric elements; and generating a haptic-target vibration based on the driving voltage.

In some embodiments, the identifying of the driving voltage for the plurality of piezoelectric elements includes identifying the driving voltage based on a first value obtained by multiplying a second value by a maximum driving voltage, the second value being a result of dividing the haptic-target vibration by a magnitude of a sum of vibration from the plurality of piezoelectric elements detectable at the touch point when the maximum driving voltage is applied to the plurality of piezoelectric elements.

It should be noted that embodiments of the disclosure are not limited to the above-described embodiments, and other aspects of the disclosure will be apparent to those skilled in the art from the following descriptions.

BRIEF DESCRIPTION OF THE DRAWINGS

The above and other aspects and features of the disclosure will become more apparent by describing exemplary embodiments thereof in detail with reference to the attached drawings, in which:

FIG. 10 is an example view illustrating a vibration method of a vibration layer disposed between first and second branch electrodes of the piezoelectric element;

DETAILED DESCRIPTION OF THE EMBODIMENTS

The aspects and features of the invention and methods for achieving the aspects and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Hereinafter, embodiments of the present invention will be described with reference to the attached drawings.

Figure 1:
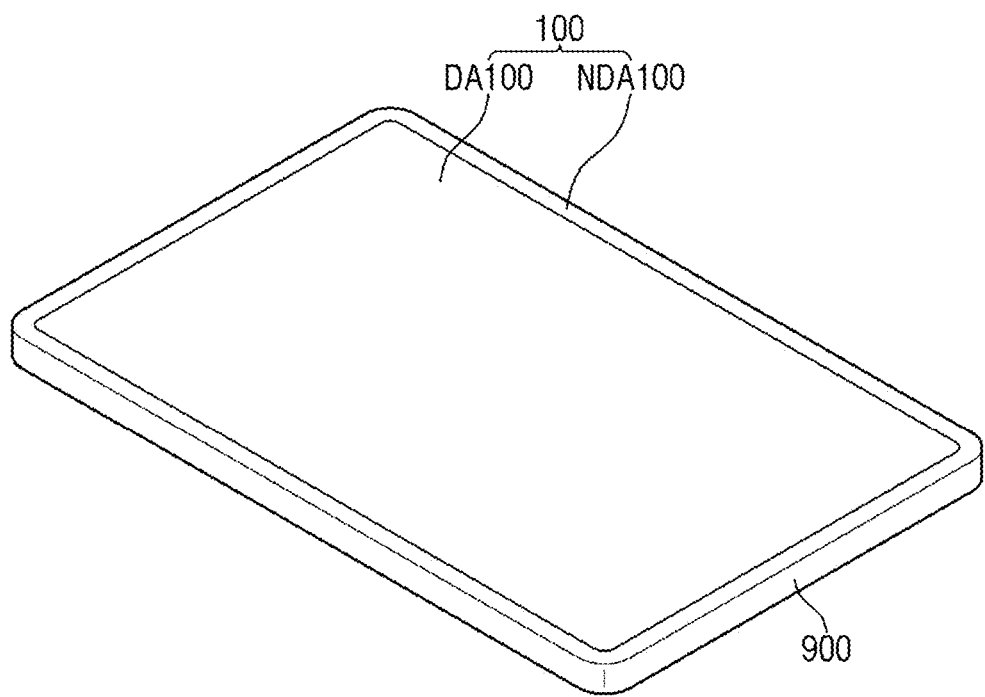
FIG. 1 is a perspective view showing a display device according to an example embodiment.
Figure 2:
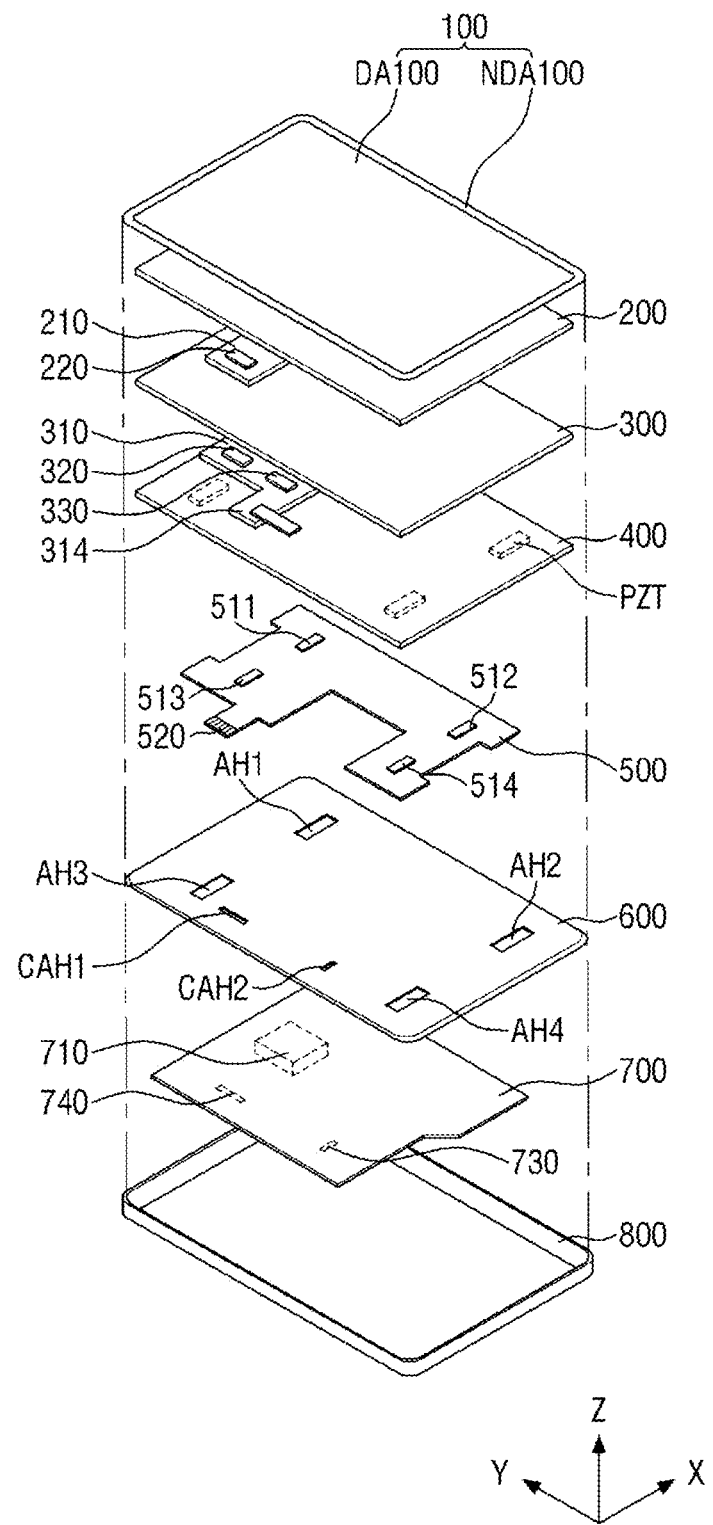
FIG. 2 is an exploded perspective view showing the display device according to the example embodiment.

FIG. 1 is a perspective view showing a display device according to an embodiment. FIG. 2 is an exploded perspective view showing the display device according to the embodiment.

Referring to FIGS. 1 and 2, a display device 10 according to the embodiment includes a cover window 100, a touch sensor 200, a touch circuit board 210, a touch driver 220, a display panel 300, a display circuit board 310, a display driver 320, a panel bottom member 400, a piezoelectric element PZT, a vibration circuit board 500, a middle frame 600, a main circuit board 700, and a bottom cover 800.

Here, the terms "upper portion," "top," or "upper surface" indicates a direction in which the cover window 100 is disposed with respect to the display panel 300, that is, a Z-axis direction, and the terms "lower portion," "bottom," or "lower surface" indicates a direction in which the middle frame 600 is disposed with respect to the display panel 300, that is, a direction opposite to the Z-axis direction. Further, the terms "left," "right," "up," and "down" indicate directions when the display panel 300 is viewed from above. For example, the term "right" refers to an X-axis direction, the term "left" refers to a direction opposite to the X-axis direction, the term "up" refers to the Z-axis direction, and the term "down" indicates the direction opposite to the Z-axis direction.

The display device 10 may have a rectangular shape when viewed from above. For example, a top view of the display device 10 may show a rectangular shape with short sides in a first direction (X-axis direction) and long sides in a second direction (Y-axis direction) as shown in FIGS. 1 and 2. A corner at which the short side in the first direction (X-axis direction) and the long side in the second direction (Y-axis direction) meet may be rounded to have a predetermined curvature or may have a right angle. The planar shape of the display device 10 is not limited to the rectangular shape but may have another polygonal shape, a circular shape, or an elliptical shape.

Figure 6:
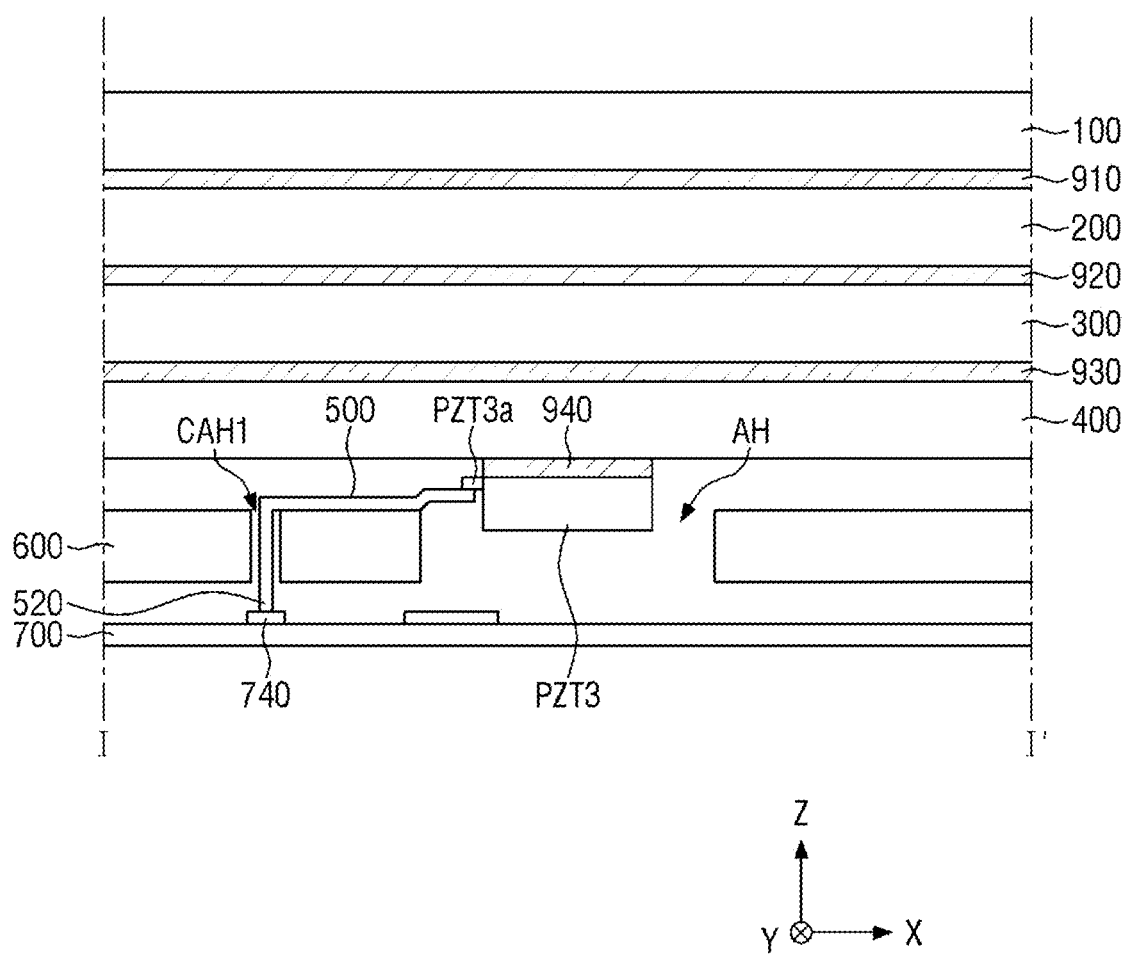
FIG. 6 is a cross-sectional view showing an example taken along the line I-I' in FIGS. 3 and 4.

The cover window 100 may be disposed above the display panel 300 to cover an upper surface of the display panel 300. Thus, the cover window 100 may function to protect the upper surface of the display panel 300. The cover window 100 may be attached to the touch sensor 200 by a first adhesive member 910 as shown in FIG. 6. The first adhesive member 910 may include an optically clear adhesive film (OCA) or an optically clear resin (OCR).

The cover window 100 may include a transmission portion DA100 corresponding to the display panel 300 and a light blocking portion NDA100 corresponding to an area excluding the display panel 300. The light blocking portion NDA100 may be opaque. In some examples, the light blocking portion NDA100 may be formed as a decorative layer having a pattern to be shown to a user when no images are displayed. For example, the light blocking portion NDA100 may be patterned with a company logo or various characters.

The cover window 100 may be made of glass, sapphire, plastic, and/or the like. The cover window 100 may be rigid or flexible.

The touch sensor 200 may be interposed between the cover window 100 and the display panel 300. The touch sensor 200 may be attached to the lower surface of the cover window 100 by the first adhesive member 910 as shown in FIG. 6. To prevent or substantially prevent visibility from being degraded by reflection of external light, a polarization film may be added onto the touch sensor 200. In this case, the polarization film may be attached to the lower surface of the cover window 100 by the first adhesive member 910.

The touch sensor 200 refers to a device for detecting a position touched by a user and may be actualized as a capacitance type such as a self-capacitance type or a mutual capacitance type. The self-capacitance type touch sensor 200 includes only touch driving electrodes, while the mutual capacitance type touch sensor 200 includes touch driving electrodes and touch detecting electrodes. Below, the mutual capacitance type touch sensor will be further described.

The touch sensor 200 may be provided in the form of a panel or a film. In this case, the touch sensor 200 may be attached to a thin film encapsulation of the display panel 300 by a second adhesive member 920 as shown in FIG. 6. The second adhesive member 920 may include the OCA or the OCR.

In some examples, the touch sensor 200 may be integrated with the display panel 300. In this case, the touch driving electrodes and the touch detecting electrodes of the touch sensor 200 may be formed on an encapsulation substrate or encapsulation film covering the thin film encapsulation of the display panel 300 or a light emitting element layer of the display panel 300.

Figure 3:
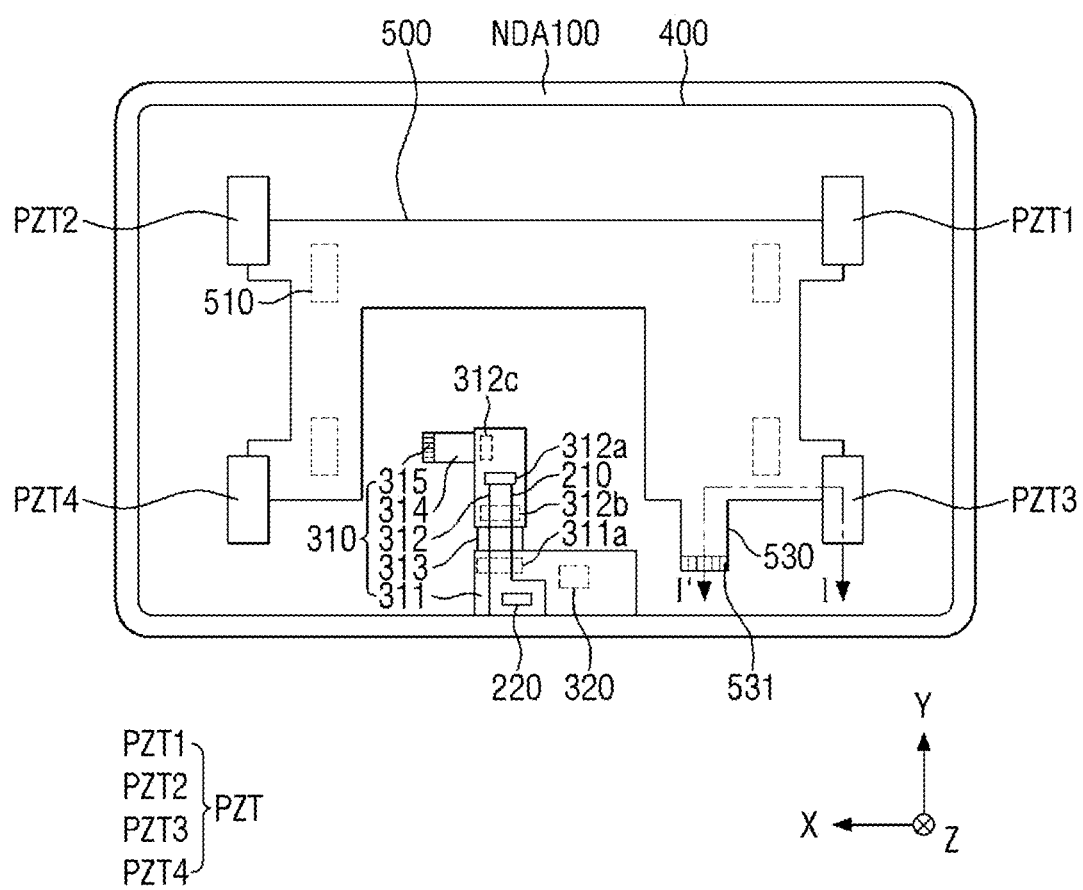
FIG. 3 is a bottom view showing examples of a cover window, a touch circuit board, a display circuit board, a panel bottom member, a piezoelectric element, and a vibration circuit board of FIG. 2.

The touch circuit board 210 may be attached to one side of the touch sensor 200. For example, one end of the touch circuit board 210 may be attached to pads provided at one side of the touch sensor 200 by an anisotropic conductive film. Further, the other end of the touch circuit board 210 may be provided with a touch connecting portion, and the touch connecting portion may be connected to a touch connector 312a of the display circuit board 310 as shown in FIG. 3. The touch circuit board may include a flexible printed circuit board.

The touch driver 220 applies touch driving signals to the touch driving electrodes of the touch sensor 200, obtains detection signals from the touch detecting electrodes of the touch sensor 200, and analyzes the detection signals to thereby identify a position touched by a user. The touch driver 220 may be provided as an integrated circuit and mounted on the touch circuit board 210.

The display panel 300 may be disposed below the touch sensor 200. The display panel 300 may be disposed to overlap the transmission portion 100DA of the cover window 100. The display panel 300 may include a light emitting display panel with the light emitting element. For example, the display panel 300 may include an organic light emitting display panel using an organic light emitting diode (LED), a micro LED display using a micro LED, or a quantum dot light emitting display panel including quantum dot LED.

The display panel 300 may include a substrate, a thin film transistor layer disposed on the substrate, an LED layer, and a thin film encapsulation layer.

The display panel 300 may be made of plastic so as to be flexible. In this case, the substrate may include a flexible substrate and a supporting substrate. The supporting substrate may be less flexible than the flexible substrate because it is configured to support the flexible substrate. Each of the flexible substrate and the supporting substrate may include a high molecular material having flexibility. For example, each of the flexible substrate and the supporting substrate may include polyethersulphone (PES), polyacrylate (PA), polyarylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or a combination thereof.

The thin film transistor layer is disposed on the substrate. The thin film transistor layer may include scan lines, data lines, and thin film transistors. Each of the thin film transistors includes a gate electrode, a semiconductor layer, and source and drain electrodes. When a scan driver is directly formed on the substrate, the scan driver may be formed together with the thin film transistor layer.

The LED layer is disposed on the thin film transistor layer. The LED layer includes an anode, a light emitting layer, a cathode, and banks. The light emitting layer may include an organic light emitting layer including organic materials. For example, the light emitting layer may include a hole injection layer, a hole transporting layer, an organic light emitting layer, an electron transporting layer, and an electron injection layer. In some examples, the hole injection layer and the electron injection layer may be omitted. When a voltage is applied to the anode and cathode, holes and electrons are moved to the organic light emitting layer via the hole transporting layer and the electron transporting layer and combined in the organic light emitting layer to thereby emit light. The LED layer may be a pixel array layer where pixels are formed, and thus an area where the LED layer is formed may be defined as a display area for displaying an image. An area around the display area may be defined as a non-display area. The bank may be formed to divide the anode electrode so as to define sub-pixels.

The thin film encapsulation layer is disposed on the LED layer. The thin film encapsulation layer serves to prevent or substantially prevent oxygen or water from infiltrating into the LED layer. The thin film encapsulation layer may include at least one inorganic film and at least one organic film.

The display circuit board 310 may be attached to one side of the display panel 300. For example, one end of the display circuit board 310 may be attached to the pads provided at one side of the display panel 300 by the anisotropic conductive film. The display circuit board 310 may be bent toward the lower surface of the display panel 300. The touch circuit board 210 may also be bent toward the lower surface of the display panel 300. Thus, the touch connecting portion provided at one end of the touch circuit board 210 may be connected to the touch connector 312a of the display circuit board 310. The detailed descriptions of the display circuit board 310 will be made with reference to FIG. 3 to FIG. 5.

The display driver 320 outputs signals and voltages for driving the display panel 300 through the display circuit board 310. The display driver 320 may be formed as an integrated circuit and mounted on the display circuit board 310 but is not limited thereto. For example, the display driver 320 may be directly attached to the substrate of the display panel 300. In this case, the display driver 320 may be attached to the upper or lower surface of the substrate of the display panel 300.

The panel bottom member 400 may be disposed below the display panel 300. The panel bottom member 400 may be attached to the lower surface of the display panel 300 by a third adhesive member 930. The third adhesive member 930 may include the OCA or the OCR.

The panel bottom member 400 may include at least one among an optical absorption member for absorbing incident light from the outside, a shock absorption member for absorbing shock from the outside, a heat dissipation member for efficiently dissipating heat from the display panel 300, and a light blocking layer for blocking incident light from the outside.

The optical absorption member may be disposed below the display panel 300. The optical absorption member prevents or substantially prevents transmission of light so as not to make elements arranged below the optical absorption member, that is, the piezoelectric element PZT, the display circuit board 310, and the like, be visible when viewed from above the display panel 300. The optical absorption member may include an optical absorption material such as black pigment, dye, etc.

The shock absorption member may be disposed below the optical absorption member. The shock absorption member absorbs an external shock to prevent or substantially prevent the display panel 300 from being damaged. The shock absorption member may include a single layer or a plurality of layers. For example, the shock absorption member may include polymer resin, such as polyurethane, polycarbonate, polypropylene, polyethylene, or the like, or may include an elastic material such as rubber, a sponge by foam-forming a urethane or acrylic group material, etc. The shock absorption member may be a cushion layer.

The heat dissipation member may be disposed below the shock absorption member. The heat dissipation member may include a first heat dissipation layer including graphite, carbon nano tubes, or the like, and a second heat dissipation layer formed as a thin film of copper, nickel, ferrite, silver, or a similar metal having excellent thermal conductivity and being used as a shield against electromagnetic waves.

The piezoelectric element PZT may be disposed below the panel bottom member 400. The piezoelectric elements PZT may be disposed to be spaced a certain distance from a corner of the panel bottom member 400. According to an embodiment, the panel bottom member 400 may have a rectangular shape, and four piezoelectric elements PZT may each be disposed to be spaced a certain distance from the vertices of the panel bottom member 400. In this case, the piezoelectric element PZT may be attached to the lower surface of the panel bottom member 400. The piezoelectric element PZT may be attached to the lower surface of the panel bottom member 400 by a fourth adhesive member 940. The fourth adhesive member 940 may include pressure sensitive adhesive (PSA).

The piezoelectric element PZT may include a pressure sensor disposed on an upper portion thereof to detect a voltage generated when pressure is applied and a haptic unit disposed on a lower portion thereof to generate vibration when the voltage is supplied.

The piezoelectric element PZT may be connected to the vibration circuit board 500. For example, one end of the vibration circuit board 500 may be connected to pad electrodes provided in at least one side of the piezoelectric element PZT. The other end of the vibration circuit board 500 may be connected to a vibration connector 740 of the main circuit board 700 via a first through hole CAH1 of the middle frame 600.

The vibration circuit board 500 may include at least one piezoelectric element driver 510. The piezoelectric element driver 510 may be provided as an integrated circuit and mounted on the vibration circuit board 500. The piezoelectric element driver 510 may generate a vibration signal in response to vibration data provided from a main processor 710 of the main circuit board 700. In this case, the vibration data of the main processor 710 may be provided to the piezoelectric element driver 510 via the main circuit board 700 and the vibration circuit board 500, and the vibration signal generated in the piezoelectric element driver 510 may be transmitted to the piezoelectric element PZT via the vibration circuit board 500.

The piezoelectric element driver 510 may include a digital signal processor (DSP) to process a digital signal, that is, the vibration data, a digital-to-analog converter (DAC) to convert the vibration data, that is, the digital signal processed by the digital signal processor into an analog signal, that is, the vibration signal, and an amplifier (AMP) to amplify and output the vibration signal, that is, the analog signal converted by the digital-to-analog converter.

The middle frame 600 may be disposed below the panel bottom member 400. The middle frame 600 may include a synthetic resin, a metal, or both synthetic resign and metal.

The middle frame 600 may be formed with the first through hole CAH1 through which the vibration circuit board 500 passes, and a second through hole CAH2 through which a second connection cable 314 connected to the display circuit board 310 passes. Further, the middle frame 600 may be formed with at least one accommodating hole AH, AH2, AH3 or AH4 to accommodate the piezoelectric element PZT. The width of the accommodating hole AH is larger than that of the piezoelectric element PZT. When the height of the piezoelectric element PZT is small, the middle frame 600 may be formed with an accommodating groove instead of the accommodating hole AH.

The main circuit board 700 may be disposed below the middle frame 600. The main circuit board 700 may be a printed circuit board or a flexible printed circuit board.

The main circuit board 700 may include the main processor 710, a main connector 730, and the vibration connector 740. The main processor 710, the main connector 730, and the vibration connector 740 may be arranged on one surface of the main circuit board 700 facing the bottom cover 800.

The main processor 710 may control all the functions of the display device 10. For example, the main processor 710 may output image data to the display driver 320 of the display circuit board 310 so that the display panel 300 may display an image. Further, the main processor 710 may identify a position touched by a user based on touch data obtained from the touch driver 220 and execute an application indicated by an icon displayed at the position touched by the user. Further, the main processor 710 may obtain the touch data from the touch driver 220 and execute an application indicated by the icon displayed at the position touched by a user in accordance with the touch data.

Further, the main processor 710 may output the vibration data to a first vibration driver 760 in a vibration output mode.

The main processor 710 may include an application processor actualized by an integrated circuit, a central processing unit, or a system chip.

The main connector 730 may be connected with the second connection cable 314 passing through the second through hole CAH2 of the middle frame 600. Thus, the main circuit board 700 may be electrically connected to the display circuit board 310 and the touch circuit board 210.

The vibration circuit board 500 passing through the first through hole CAH1 of the middle frame 600 may be connected to the vibration connector 740 disposed on the upper surface of the main circuit board 700.

In addition, the main circuit board 700 may further include a mobile communication module for transmitting and receiving a wireless signal to and from at least one of a base station, an external terminal, and a server via a mobile communication network. The wireless signal may include an audio signal, a video call signal, or various types of data based on a transceiving text/multimedia message.

The bottom cover 800 may be disposed below the middle frame 600 and the main circuit board 700. The bottom cover 800 may be fixedly coupled to the middle frame 600. The bottom cover 800 may form an outer exterior of the bottom of the display device 10. The bottom cover 800 may include plastic and/or metal.

Figure 4:
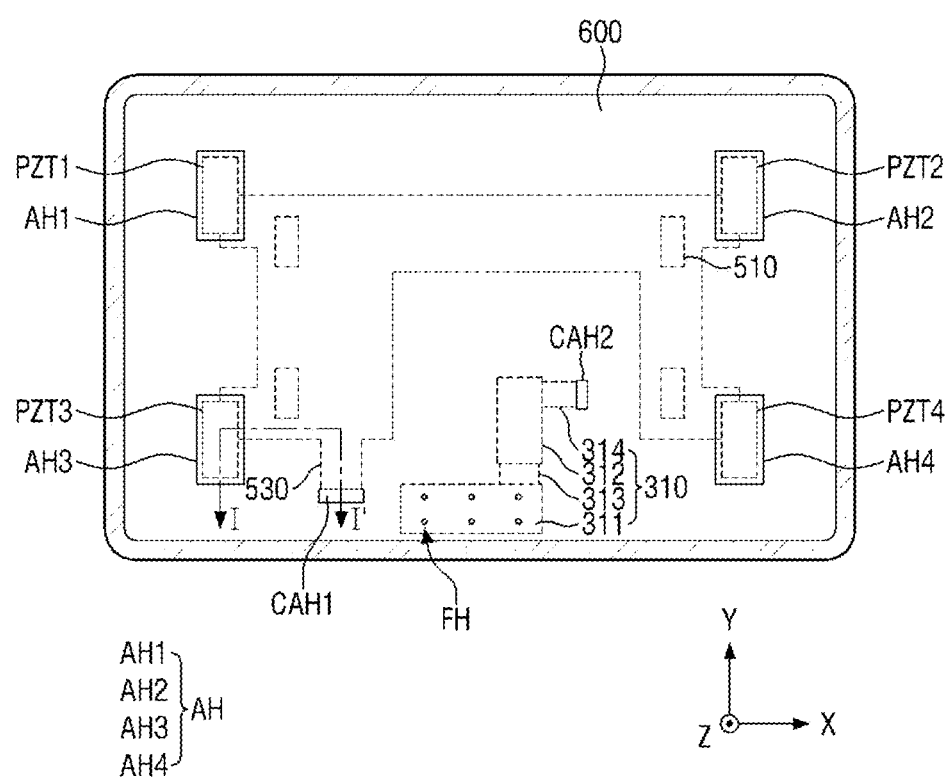
FIG. 4 is a plan view showing examples of the display circuit board, a second connection cable, the piezoelectric element, the vibration circuit board, and a middle frame of FIG. 2.
Figure 5:
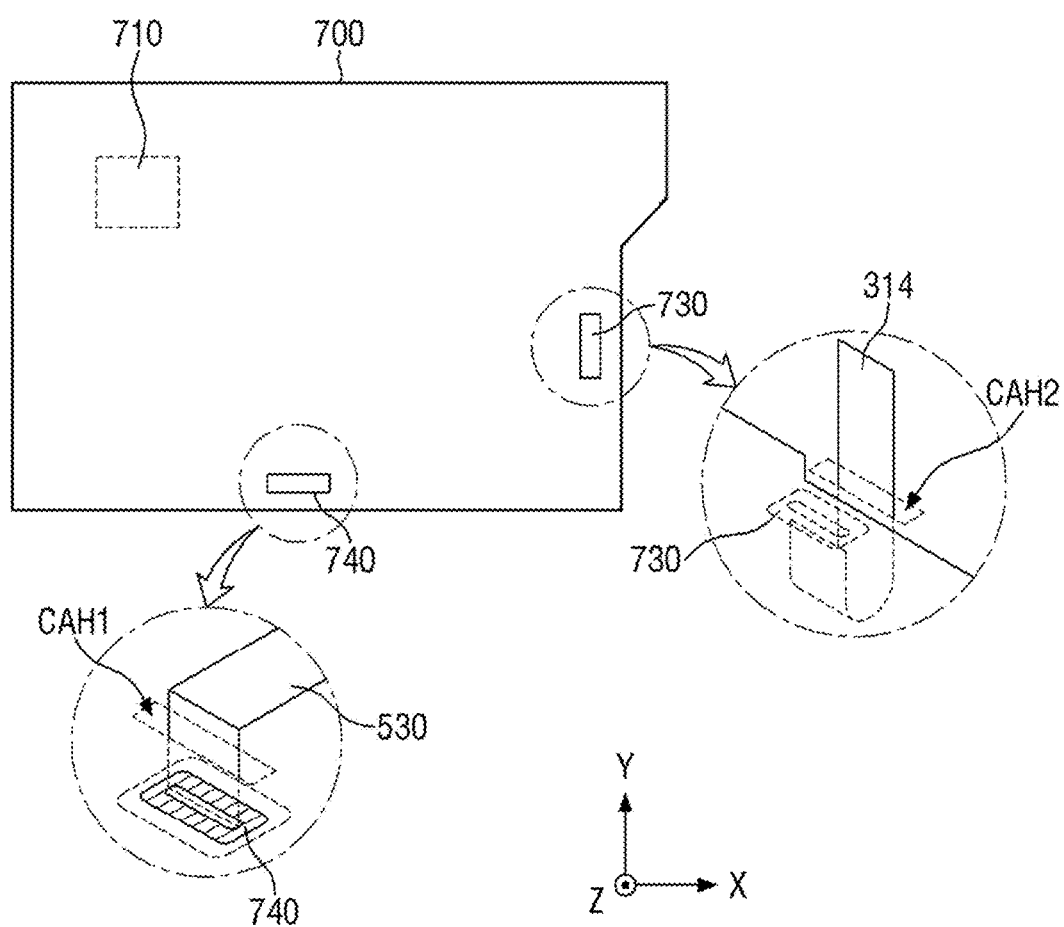
FIG. 5 is a plan view showing examples of the second connection cable, the vibration circuit board, and a main circuit board of FIG. 2.

FIG. 3 is a bottom view showing examples of the cover window, the touch circuit board, the display circuit board, the panel bottom member, the piezoelectric element, and the vibration circuit board of FIG. 2. FIG. 4 is a plan view showing examples of the display circuit board, the second connection cable, the piezoelectric element, the vibration circuit board, and the middle frame of FIG. 2. FIG. 5 is a plan view showing examples of the second connection cable, the vibration circuit board, and the main circuit board of FIG. 2. FIGS. 4 and 5 are the plan views, while FIG. 3 is the bottom view. Therefore, it should be noted that the left and right of the display device 10 in FIGS. 4 and 5 are reversed in FIG. 3.

Below, it will be described in detail in association with FIGS. 3 to 5 that the vibration circuit board 500 connected to the piezoelectric element PZT is connected to the vibration connector 740 of the main circuit board 700, and the second connection cable 314 connected to the display circuit board 310 is connected to the main connector 730 of the main circuit board 700.

Referring to FIGS. 3 to 5, one end of the vibration circuit board 500 may be connected to the pad electrodes provided on at least one side of the piezoelectric element PZT. The other end of the vibration circuit board 500 may be provided with a vibration connecting portion 531. The vibration connecting portion 531 of the vibration circuit board 500 may be connected to the vibration connector 740 disposed on the upper surface of the main circuit board 700 via the first through hole CAH1 of the middle frame 600.

The display circuit board 310 may include a first circuit board 311, a second circuit board 312, and a first connection cable 313.

The first circuit board 311 may be attached to one side on the upper or lower surface of the substrate of the display panel 300 and bent toward the lower surface of the substrate of the display panel 300. The first circuit board 311 may be fastened to fastening holes FH formed in the middle frame 600 as shown in FIG. 4 by fastening members.

The first circuit board 311 may include the display driver 320 and a first connector 311a. The display driver 320 and the first connector 311a may be arranged on one surface of the first circuit board 311.

The first connector 311a may be connected to one end of the first connection cable 313 connected to the second circuit board 312. Thus, the display driver 320 mounted on the first circuit board 311 may be electrically connected to the second circuit board 312 by the first connection cable 313.

The second circuit board 312 may include the touch connector 312a, a first connecting connector 312b, and a second connecting connector 312c. The first connecting connector 312b and the second connecting connector 312c may be arranged on one surface of the second circuit board 312, and the touch connector 312a may be disposed on the other surface of the second circuit board 312.

The touch connector 312a may be connected to the touch connecting portion provided at one end of the touch circuit board 210. Thus, the touch driver 220 may be electrically connected to the second circuit board 312.

The first connecting connector 312b may be connected to the other end of the first connection cable 313 connected to the first circuit board 311. Thus, the display driver 320 mounted on the first circuit board 311 may be electrically connected to the second circuit board 312 by the first connection cable 313.

The second connecting connector 312c may be connected to one end of the second connection cable 314 connected to the main connector 730 of the main circuit board 700. Thus, the second circuit board 312 may be electrically connected to the main circuit board 700 by the second connection cable 314.

The other end of the second connection cable 314 may be formed with a connector connecting portion 315. The connector connecting portion 315 of the second connection cable 314 may extend to the lower portion of the middle frame 600 via the second through hole CAH2 of the middle frame 600 as shown in FIG. 4. Further, the connector connecting portion 315 of the second connection cable 314 passing through the second through hole CAH2 as shown in FIG. 5 may come out through a gap between the middle frame 600 and the main circuit board 700 and extend to the lower portion of the main circuit board 700. Finally, the connector connecting portion 315 of the second connection cable 314 may be connected to the main connector 730 disposed on the lower surface of the main circuit board 700 as shown in FIG. 5.

In the embodiment shown in FIGS. 3 to 5, the vibration circuit board 500 connected to the piezoelectric element PZT may be connected to the vibration connector 740 of the main circuit board 700 via the first through hole CAH1 of the middle frame 600.

Further, as shown in FIGS. 3 to 5, the second connection cable 314 connected to the display circuit board 310 may extend to the lower portion of the middle frame 600 via the second through hole CAH2 of the middle frame 600 and connected to the main connector 730 of the main circuit board 700. Therefore, the display circuit board 310 and the main circuit board 700 are stably connected.

FIG. 6 is a cross-sectional view showing an example taken along the line I-I' in FIGS. 3 and 4.

The cover window 100, the touch sensor 200, the display panel 300, the panel bottom member 400, the first adhesive member 910, the second adhesive member 920, and the third adhesive member 930 shown in FIG. 6 have been described in detail with reference to FIGS. 1 and 2, and thus detailed descriptions thereof may not be repeated.

Referring to FIG. 6, the piezoelectric element PZT may be disposed in the lower portion of the panel bottom member 400. The piezoelectric element PZT may be attached to the lower surface of the panel bottom member 400 by the fourth adhesive member 940. The fourth adhesive member 940 may include the PSA.

First pad electrodes PZT3a of the piezoelectric element PZT may be disposed to protrude from at least one side of the piezoelectric element PZT. The first pad electrodes PZT3a of the piezoelectric element PZT may be connected to one end of the vibration circuit board 500. FIG. 6 illustrates the upper surface of one end of the vibration circuit board 500 connected to the lower surface of the first pad electrode PZT3a, but the disclosure is not limited thereto. For example, the lower surface of one end of the vibration circuit board 500 may be connected to the upper surface of the first pad electrode PZT3a. The other end of the vibration circuit board 500 may be connected to the vibration connector 740 disposed on the upper surface of the main circuit board 700 via the first through hole CAH1 passing through the middle frame 600.

The piezoelectric element PZT may be disposed in the accommodating hole AH passing through the middle frame 600. When the height of the piezoelectric element PZT is small, the middle frame 600 may be formed with the accommodating groove instead of the accommodating hole AH.

Figure 7:
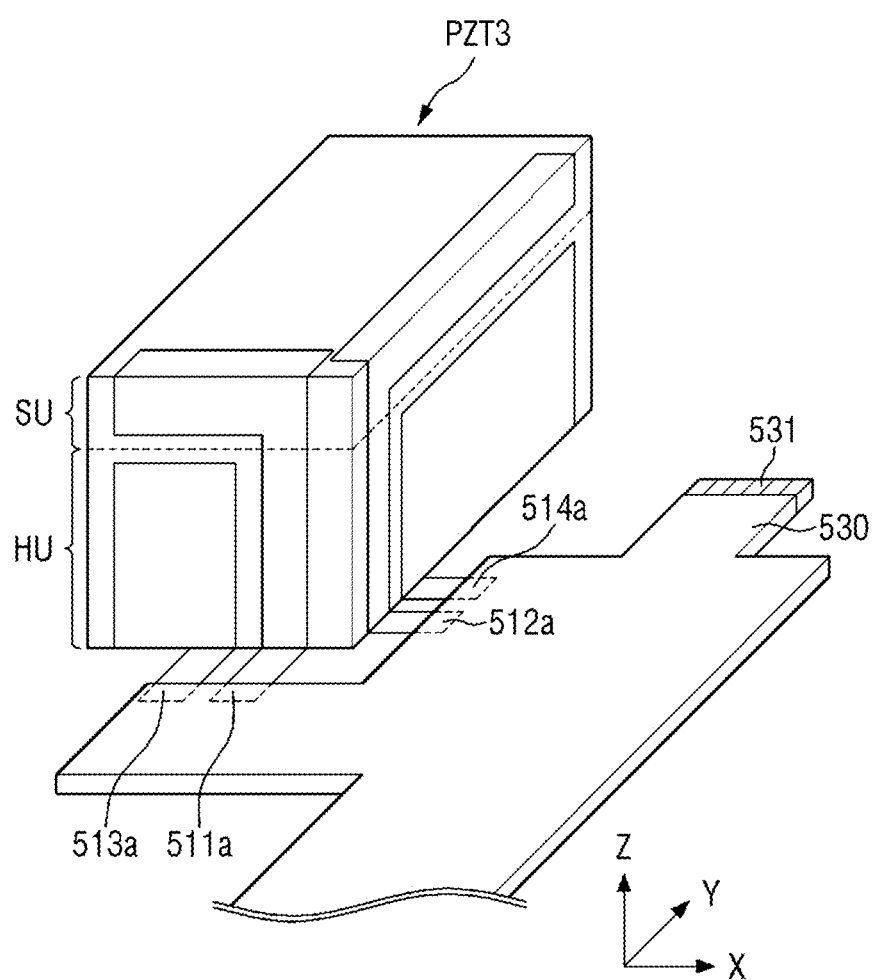
FIG. 7 is a perspective view showing an example of the piezoelectric element of FIG. 6.
Figure 8:
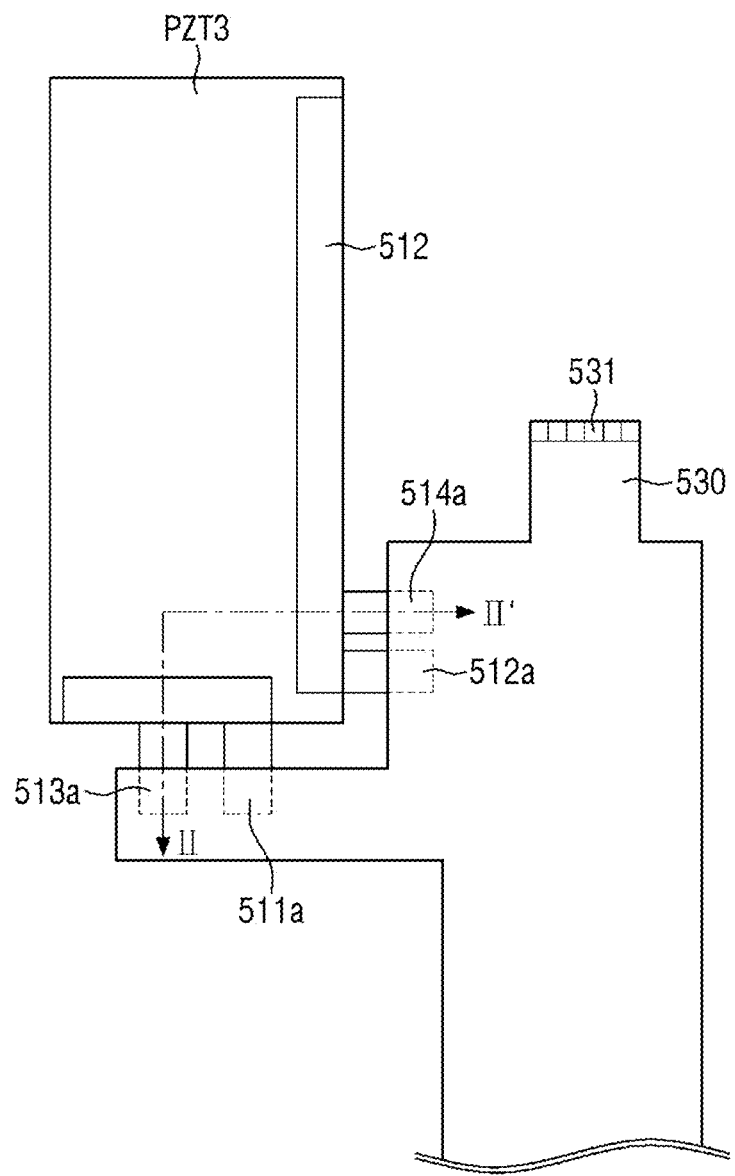
FIG. 8 is a plan view showing an example of the piezoelectric element of FIG. 6.
Figure 9A:
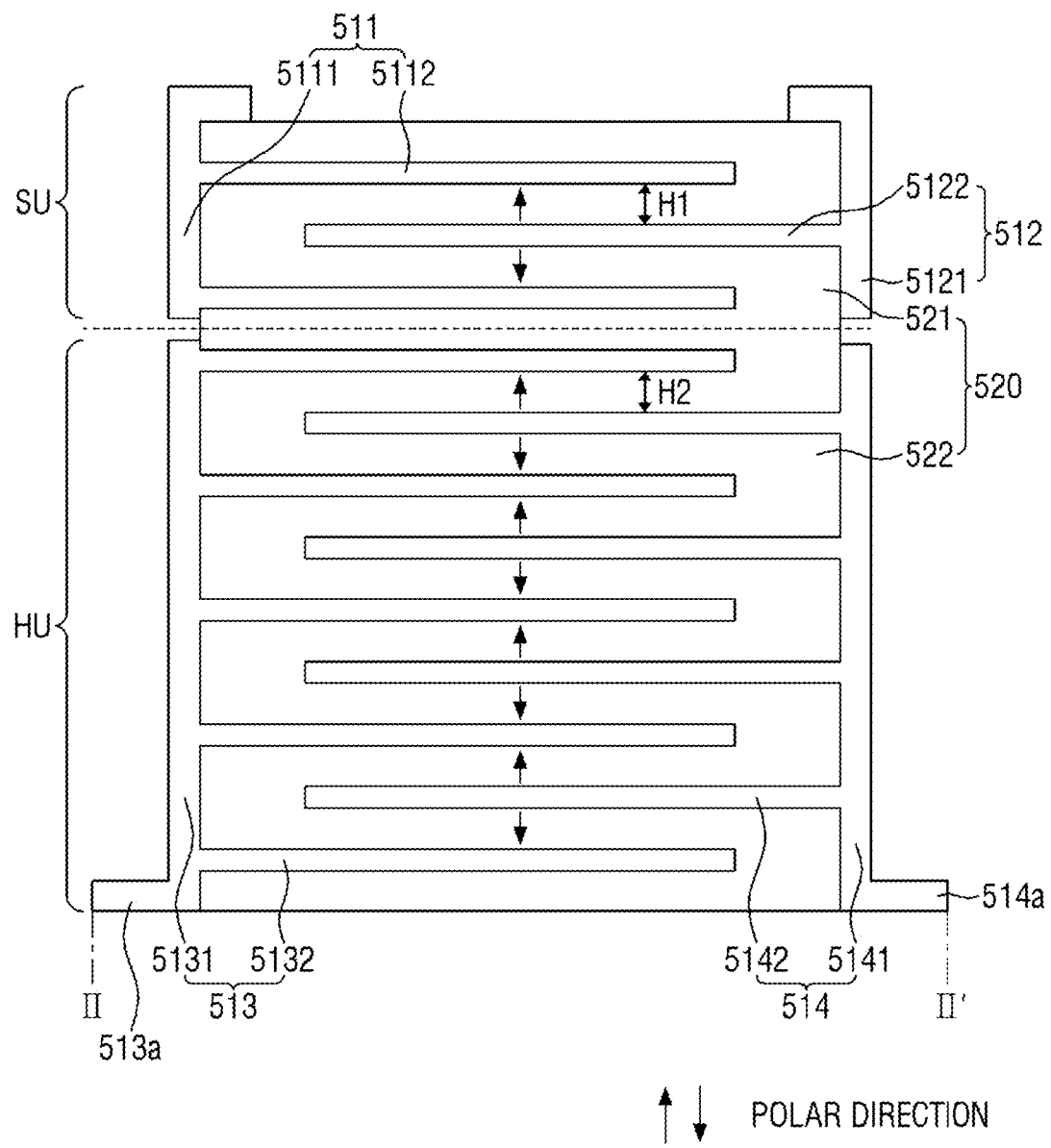
FIGS. 9A-9B are cross-sectional views taken along the line II-II' in FIG. 8.
Figure 9B:
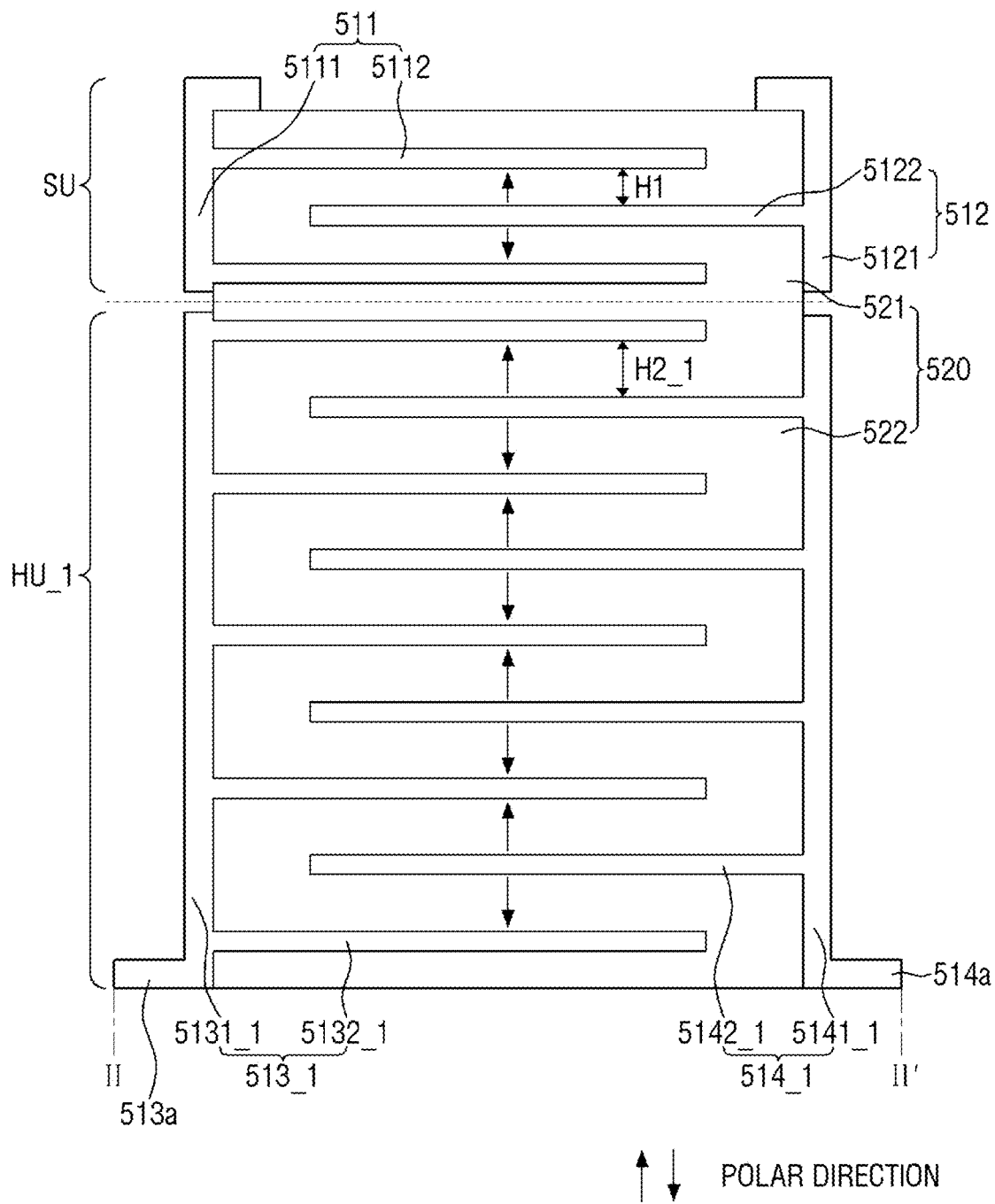
Figure 9C:
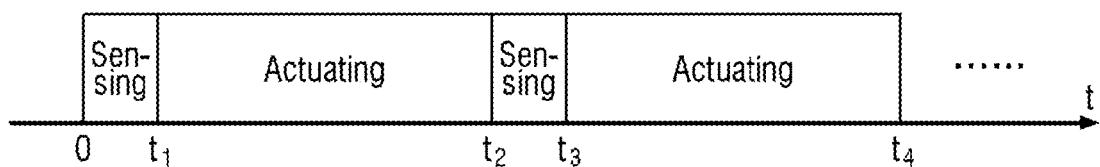
FIG. 9C is a view showing a method of driving a piezoelectric element according to an example embodiment.

FIG. 7 is a perspective view showing an example of the piezoelectric element of FIG. 6. FIG. 8 is a plan view showing an example of the piezoelectric element of FIG. 6. FIGS. 9A and 9B are cross-sectional views taken along the line II-II' in FIG. 8. FIG. 9C is a view showing a method of driving a piezoelectric element according to an embodiment.

Below, the piezoelectric element PZT will be described in detail with reference to FIGS. 7, 8, and 9A to 9C. For convenience of description, a third piezoelectric electrode PZT3 will be described by way of example. However, the following description is not limited to the third piezoelectric electrode PZT3 but may be equally applied to the other piezoelectric elements PZT.

Referring to FIGS. 7, 8, and 9A to 9C, the third piezoelectric electrode PZT3 may include a pressure sensor SU to detect voltage generated when pressure is applied and a haptic unit (e.g., a haptic device) HU to generate vibration when the voltage is applied.

FIGS. 7, 8, and 9A illustrate an example in which the pressure sensor SU is disposed in the upper portion of the third piezoelectric electrode PZT3 and the haptic unit HU is disposed in the lower portion of the third piezoelectric electrode PZT3, but the arrangement is not limited to this example. For example, the pressure sensor SU may be disposed in the lower portion of the third piezoelectric electrode PZT3, and the haptic unit HU may be disposed in the upper portion of the third piezoelectric electrode PZT3. In some examples, pressure sensors SU may be arranged in both the upper portion and the lower portion of the third piezoelectric electrode PZT3, and the haptic unit HU may be interposed between the pressure sensors SU. In other words, the haptic unit HU may be disposed in the middle of the third piezoelectric electrode PZT3. In FIGS. 7, 8, and 9A, the pressure sensor SU and the haptic unit HU may be arranged in a row in a vertical direction (or Z-axis direction). The vertical direction (or Z-axis direction) may refer to the height direction of the third piezoelectric electrode PZT3 (or a piezoelectric polymer layer 520).

The pressure sensor SU may include a first electrode 511, a second electrode 512, and a first piezoelectric polymer layer 521 of the piezoelectric polymer layer 520. The haptic unit HU may include a third electrode 513, a fourth electrode 514, and a second piezoelectric polymer layer 522 of the piezoelectric polymer layer 520.

The first electrode 511 may include a first stem electrode 5111 and first branch electrodes 5112. FIG. 9A illustrates an example of the first stem electrode 5111 disposed at one lateral side of the piezoelectric polymer layer 520, but the arrangement is not limited to this example. For example, the first stem electrode 5111 may be disposed at a plurality of lateral sides of the piezoelectric polymer layer 520. The first stem electrode 5111 may be disposed on the upper surface of the piezoelectric polymer layer 520. The first branch electrodes 5112 may be branched out from the first stem electrode 5111. The first branch electrodes 5112 may be arranged in parallel.

The second electrode 512 may include a second stem electrode 5121 and second branch electrodes 5122. FIG. 9A illustrates an example of the second stem electrode 5121 disposed on another lateral side of the piezoelectric polymer layer 520, but the arrangement is not limited to this example. For example, the second stem electrode 5121 may be disposed on a plurality of lateral sides of the piezoelectric polymer layer 520 in which the first stem electrode 5111 is not disposed. The second stem electrode 5121 may be disposed on the upper surface of the piezoelectric polymer layer 520. The second branch electrodes 5122 may be branched out from the second stem electrode 5121. The second branch electrodes 5122 may be arranged in parallel.

The first branch electrodes 5112 and the second branch electrodes 5122 may be arranged in parallel in a horizontal direction (or X-axis direction or Y-axis direction). Further, the first branch electrodes 5112 and the second branch electrodes 5122 may be alternately arranged in the vertical direction (or Z-axis direction). That is, the first branch electrodes 5112 and the second branch electrodes 5122 may be repetitively arranged in the vertical direction (or Z-axis direction) in order of the first branch electrode 5112, the second branch electrode 5122, the first branch electrode 5112, and the second branch electrode 5122. The horizontal direction (or X-axis direction or Y-axis direction) may refer to a first width direction or a second width direction of the piezoelectric polymer layer 520, and the vertical direction (or Z-axis direction) may refer to the height direction of the piezoelectric polymer layer 520.

The third electrode 513 may include a third stem electrode 5131 and third branch electrodes 5132. FIG. 7 illustrates an example of the third stem electrode 5131 disposed at one lateral side of the piezoelectric polymer layer 520, but the arrangement is not limited to this example. For example, the third stem electrode 5131 may be disposed at a plurality of lateral sides of the piezoelectric polymer layer 520. The third stem electrode 5131 may be disposed at a lateral side of the piezoelectric polymer layer 520 where the first stem electrode 5111 is disposed. The third branch electrodes 5132 may be branched out from the third electrode 513. The third branch electrodes 5132 may be arranged in parallel.

The fourth electrode 514 may include a fourth stem electrode 5141 and fourth branch electrodes 5142. FIG. 7 illustrates an example of the fourth stem electrode 5141 disposed at another lateral side of the piezoelectric polymer layer 520, but the arrangement is not limited to this example. For example, the fourth stem electrode 5141 may be disposed at a plurality of lateral sides of the piezoelectric polymer layer 520 where the third stem electrode 5131 is not disposed. The fourth stem electrode 5141 may be disposed at the lateral side of the piezoelectric polymer layer 520 where the second stem electrode 5121 is disposed. The fourth branch electrodes 5142 may be branched out from the fourth stem electrode 5141. The fourth branch electrodes 5142 may be arranged in parallel.

The third branch electrodes 5132 and the fourth branch electrodes 5142 may be arranged in parallel in the horizontal direction (or X-axis direction or Y-axis direction). Further, the third branch electrodes 5132 and the fourth branch electrodes 5142 may be alternately arranged in the vertical direction (or Z-axis direction). That is, the third branch electrodes 5132 and the fourth branch electrodes 5142 may be repetitively arranged in the vertical direction (or Z-axis direction) in order of the third branch electrode 5132, the fourth branch electrode 5142, the third branch electrode 5132, and the fourth branch electrode 5142.

The first electrode 511, the second electrode 512, the third electrode 513, and the fourth electrode 514 may be made of silver (Ag) or alloy of silver (Ag) and palladium (Pd), which has a high melting point, because a fabrication temperature for the piezoelectric polymer layer 520 is high. When the first electrode 511 and the second electrode 512 are made of the alloy of silver (Ag) and palladium (Pd), a content of silver (Ag) may be higher than that of palladium (Pd).

A first pad electrode 511*a* may be connected to the first electrode 511. The first pad electrode 511*a* may protrude outward from the first stem electrode 5111 disposed at one lateral side of the piezoelectric polymer layer 520.

A second pad electrode 512*a* may be connected to the second electrode 512. The second pad electrode 512*a* may protrude outward from the second stem electrode 5121 disposed at the other lateral side of the piezoelectric polymer layer 520.

A third pad electrode 513*a* may be connected to the third electrode 513. The third pad electrode 513*a* may protrude outward from the third stem electrode 5131 disposed at one lateral side of the piezoelectric polymer layer 520.

A fourth pad electrode 514a may be connected to the fourth electrode 514. The fourth pad electrode 514a may protrude outward from the fourth stem electrode 5141 disposed at the other lateral side of the piezoelectric polymer layer 520.

The first pad electrode 511a, the second pad electrode 512a, the third pad electrode 513a, and the fourth pad electrode 514a may be connected to the lead lines or the pad electrodes of the vibration circuit board 500. The lead lines or pad electrodes of the vibration circuit board 500 may be arranged on the lower surface of the vibration circuit board 500.

As shown in FIG. 7, when the first pad electrode 511a and the third pad electrode 513a protrude from one lateral side of the piezoelectric polymer layer 520, and when the second pad electrode 512a and the fourth pad electrode 514a protrude from the other lateral side of the piezoelectric polymer layer 520, the vibration circuit board 500 may be disposed on one lateral side and the other lateral side of the third piezoelectric electrode PZT3 but are not limited thereto. The first pad electrode 511a, the second pad electrode 512a, the third pad electrode 513a, and the fourth pad electrode 514a may protrude from one lateral side of the piezoelectric polymer layer 520. In this case, the vibration circuit board 500 may be disposed on one lateral side of the third piezoelectric electrode PZT3.

The piezoelectric polymer layer 520 may include a transparent piezoelectric material that contracts or expands based on a first driving voltage applied to the third electrode 513 and a second driving voltage applied to the fourth electrode 514 as a sensing voltage is generated between the first electrode 511 and the second electrode 512 when pressure is applied thereto. In this case, the piezoelectric material may include one of a piezoelectric material, such as a poly vinylidene fluoride (PVDF) film, lead zirconate titanate (PZT), or the like, and electro active polymer.

The piezoelectric polymer layer 520 may include the first piezoelectric polymer layer 521 and the second piezoelectric polymer layer 522. The first piezoelectric polymer layer 521 indicates the area of the piezoelectric polymer layer 520 corresponding to the pressure sensor SU, and the second piezoelectric polymer layer 522 indicates the area of the piezoelectric polymer layer 520 corresponding to the haptic unit HU.

The piezoelectric polymer layer 520 may be disposed between the first branch electrodes 5112 and the second branch electrodes 5122 in the first piezoelectric polymer layer 521. When the piezoelectric polymer layer 520 is contracted or expanded by external pressure, a voltage is generated in proportion to pressure applied between the first branch electrodes 5112 and the second branch electrodes 5122. The piezoelectric polymer layer 520 may be disposed between the third branch electrodes 5132 and the fourth branch electrodes 5142 in the second piezoelectric polymer layer 522. The piezoelectric polymer layer 520 may be contracted or extended based on a difference between the first driving voltage applied to the third branch electrodes 5132 in a third vibration layer 523 and the second driving voltage applied to the fourth branch electrodes 5142.

As shown in FIG. 9A, a distance H1 in the vertical direction (or Z-axis direction) between the first branch electrodes 5112 and the second branch electrodes 5122 may be equal to a distance H2 in the vertical direction between the third branch electrodes 5132 and the fourth branch electrodes 5142. However, although the disclosure is not limited the following embodiments, the distance in the vertical direction between the first branch electrodes 5112 and the second branch electrodes 5122 according to some embodiments may be different from the distance in the vertical direction between the third branch electrodes 5132 and the fourth branch electrodes 5142. For example, referring to FIG. 9B, a distance H2_1 in the vertical direction between third branch electrodes 5132_1 and fourth branch electrodes 5142_1 may be greater than the distance H1 in the vertical direction between the first branch electrodes 5112 and the second branch electrodes 5122. Because the magnitude of the vibration in the haptic unit HU is proportional to the area of the haptic unit HU, the area of the second piezoelectric polymer layer 522 may be larger than that of the first piezoelectric polymer layer 521 when the magnitude of the vibration in the haptic unit HU is taken into account. Further, the number of first branch electrodes 5112 or the number of second branch electrodes 5122 may be less than the number of third branch electrodes 5132 or the number of fourth branch electrodes 5142.

Below, a vibration method of the second piezoelectric polymer layer 522 in the piezoelectric polymer layer 520 will be described in detail in association with FIGS. 9A and 10.

For example, as shown in FIG. 9A, the second piezoelectric polymer layer 522 disposed between the third branch electrode 5132 and the fourth branch electrode 5142 disposed below the third branch electrode 5132 may have an upward polar direction (↑). In this case, the second piezoelectric polymer layer 522 has a positive polarity in an upper portion area adjacent to the third branch electrode 5132 and has a negative polarity in a lower portion area adjacent to the fourth branch electrode 5142. Further, the second piezoelectric polymer layer 522 disposed between the fourth branch electrode 5142 and the third branch electrode 5132 disposed below the fourth branch electrode 5142 may have a downward polar direction (↓). In this case, the second piezoelectric polymer layer 522 has a negative polarity in an upper portion area adjacent to the fourth branch electrode 5142 and has a positive polarity in a lower portion area adjacent to the third branch electrode 5132. The polar direction of the second piezoelectric polymer layer 522 may be set by a poling process of applying an electric field to the second piezoelectric polymer layer 522 through the third branch electrode 5132 and the fourth branch electrode 5142.

As shown in FIG. 10, when the second piezoelectric polymer layer 522 disposed between the third branch electrode 5132 and the fourth branch electrode 5142 disposed below the third branch electrode 5132 has the upward polar direction (↑), the first driving voltage having the positive polarity is applied to the third branch electrode 5132. When the second driving voltage having the negative polarity is applied to the fourth branch electrode 5142, the second piezoelectric polymer layer 522 may contract based on a first force F1. The first force F1 may be a contracting force. Further, when the first driving voltage having the negative polarity is applied to the third branch electrode 5132, and when the second driving voltage having the positive polarity is applied to the fourth branch electrode 5142, the second piezoelectric polymer layer 522 may expand based on a second force F2. The second force F2 may be an expanding force.

Further, when the second piezoelectric polymer layer 522 disposed between the fourth branch electrode 5142 and the third branch electrode 5132 disposed below the fourth branch electrode 5142 has the downward polar direction (↓), the first driving voltage having the positive polarity is applied to the fourth branch electrode 5142. When the second driving voltage having the negative polarity is applied to the third branch electrode 5132, the second piezoelectric polymer layer 522 may expand based on the expanding force. Further, when the first driving voltage having the negative polarity is applied to the fourth branch electrode 5142, and the second driving voltage having the positive polarity is applied to the third branch electrode 5132, the second piezoelectric polymer layer 522 may contract based on the contractive force F2. The second force F2 may be the expanding force.

In the embodiment shown in FIG. 9A, when the first driving voltage applied to the third electrode 513 and the second driving voltage applied to the fourth electrode 514 are alternated between the positive polarity and the negative polarity, the second piezoelectric polymer layer 522 repeats the contraction and the expansion. Thus, the piezoelectric element PZT vibrates.

As described above, the pressure sensor SU for detecting a voltage generated based on applied pressure and the haptic unit HU for generating vibration when the voltage is applied are spatially divided in the piezoelectric element PZT. Nevertheless, the pressure sensor SU may be affected by the vibration generated in the haptic unit HU when the pressure sensor SU and the haptic unit HU are driven concurrently (e.g., simultaneously), and therefore pressure may be not accurately detected. Thus, it is desirable for the piezoelectric element PZT to drive each of the two functions at different times.

According to an embodiment, the pressure sensor SU and the haptic unit HU of the piezoelectric element PZT may be time-divisionally driven in sequence. Referring to FIGS. 5 and 9C, for example, the piezoelectric element PZT may be allowed to drive only the pressure sensor SU for first periods of time from 0 to t1 and from t1 to t3 and may be allowed to drive only the haptic unit HU for second periods of time from t1 to t2 and from t3 to t4. The main processor 710 may sequentially drive the piezoelectric element PZT within one cycle including the first periods of time and the second periods of time. In this case, the first period of time may be shorter than the second period of time.

Figure 11A:
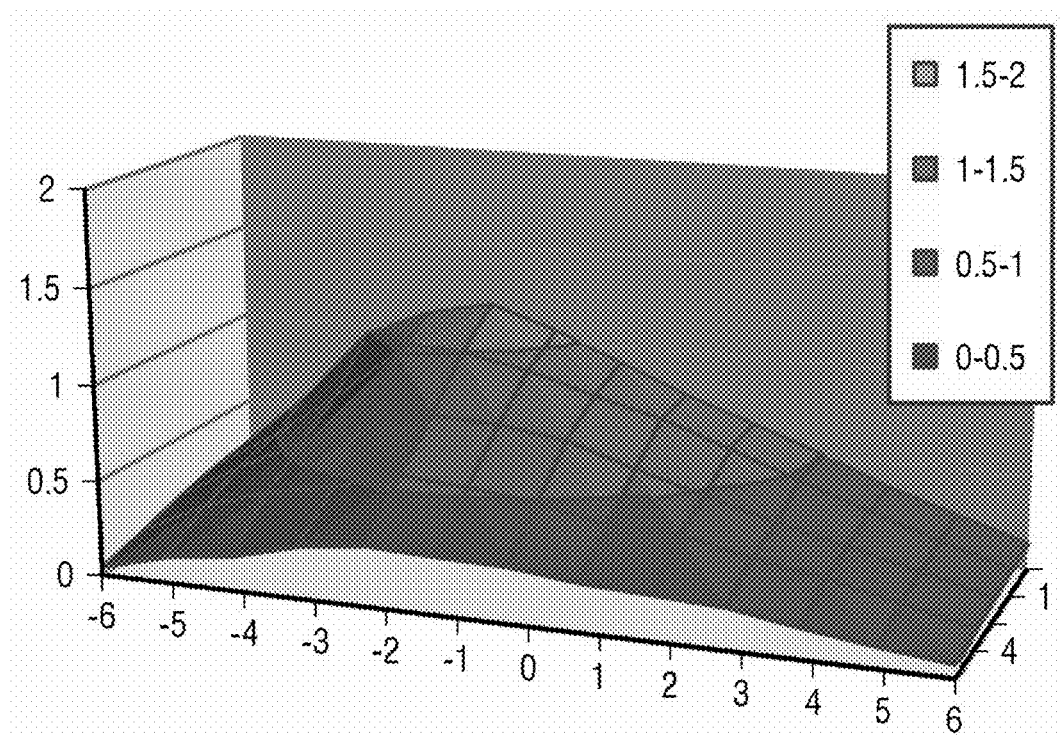
FIGS. 11A-11B are graphs showing a magnitude of vibration generated when piezoelectric elements shown in FIG. 4 are individually driven.
Figure 11B:
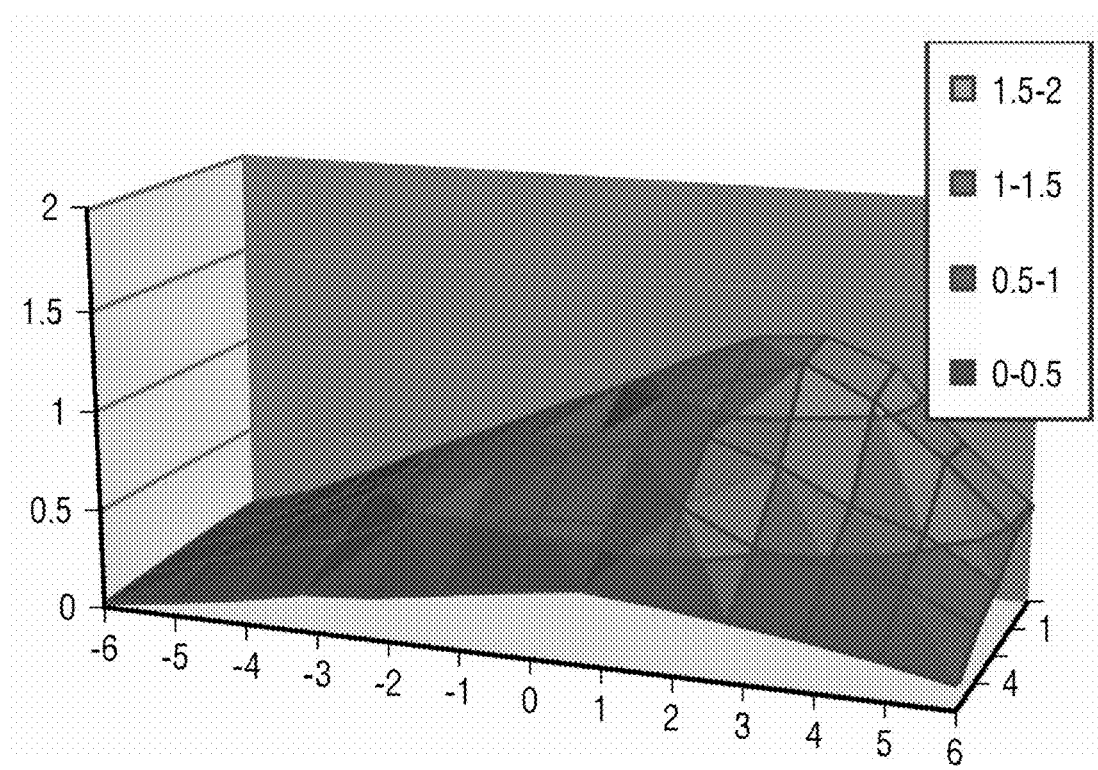
Figure 11C:
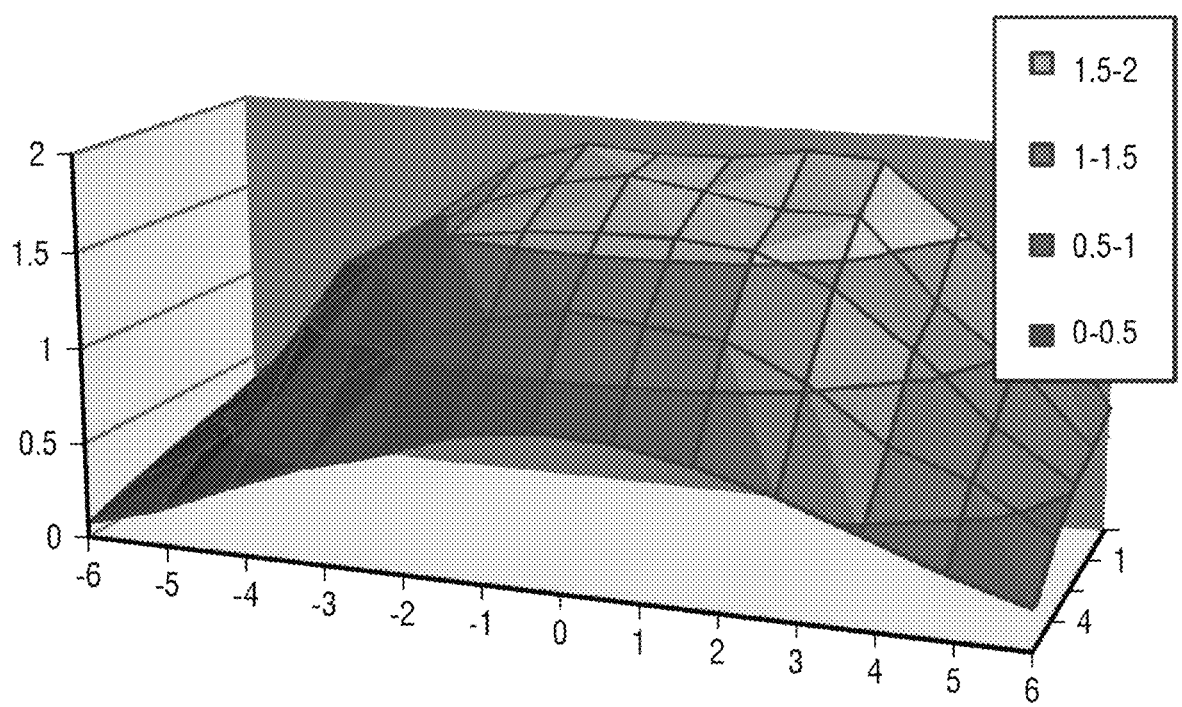
FIG. 11C is a graph showing a magnitude of vibration generated when piezoelectric elements shown in FIG. 3 are simultaneously driven.
Figure 12:
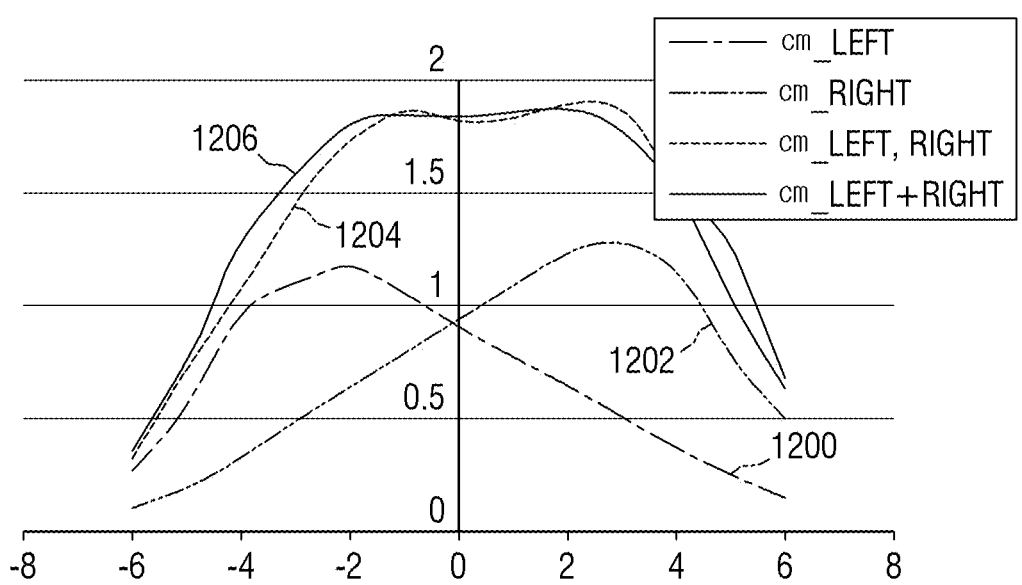
FIG. 12 is a graph showing a vibration magnitude of a piezoelectric element depending on positions thereof.

However, the method of solving the problem that may arise when the pressure sensor SU and the haptic unit HU are driven at once is not limited to the foregoing sequential driving method. For example, the driving of the haptic unit HU may take priority over the driving of the pressure sensor SU. In other words, the main processor 710 does not drive the pressure sensor SU while the piezoelectric element PZT generates vibration as a voltage is applied to the haptic unit HU, but drives the pressure sensor SU to sense the pressure only while voltage is not applied to the haptic unit HU. FIGS. 11A and 11B are graphs showing the magnitude of the vibration generated when the piezoelectric elements PZT1 and PZT2 shown in FIG. 4 are individually driven. FIG. 11C is a graph showing the magnitude of the vibration generated when the piezoelectric elements PZT1 and PZT2 shown in FIG. 4 are concurrently (e.g., simultaneously) driven. FIG. 12 is a graph showing the magnitude of the vibration according to the positions of the piezoelectric element.

Referring to FIGS. 4, 11A and 11B, the first piezoelectric element PZT1, the second piezoelectric element PZT2, the third piezoelectric electrode PZT3, and the fourth piezoelectric element PZT4 may be respectively arranged at an upper left portion, an upper right portion, a lower left portion, and a lower right portion from a viewing direction of the display panel 300. Referring to FIG. 11A, when the first piezoelectric element PZT1 alone is driven, the magnitude of the vibration may be gradually decreased in a direction farther away from the center of the upper left portion where the first piezoelectric element PZT1 is disposed. In this case, the magnitude of the vibration may be expressed in units of acceleration of gravity G. For example, as shown in FIG. 11A, the upper left portion where the first piezoelectric element PZT1 is disposed may vibrate with the maximum magnitude of about 1.2 G. Referring to FIG. 11B, when the second piezoelectric element PZT2 alone is driven, the magnitude of the vibration may be gradually decreased in a direction farther away from the center of the upper right portion where the second piezoelectric element PZT2 is disposed. For example, as shown in FIG. 11B, the upper right portion where the second piezoelectric element PZT2 is disposed may vibrate with the maximum magnitude of about 1.2 G.

Referring to FIGS. 4 and 11C, when both the first piezoelectric element PZT1 and the second piezoelectric element PZT2 are driven at once, the magnitude of the vibration may be gradually decreased in a direction farther away from each center of the upper left portion where the first piezoelectric element PZT1 is disposed and the upper right portion where the second piezoelectric element PZT2 is disposed. For example, as shown in FIG. 11C, the upper left portion where the first piezoelectric element PZT1 is disposed and the upper right portion where the second piezoelectric element PZT2 is disposed may vibrate with the maximum magnitude of about 1.8 G.

The magnitude of the sum of the vibrational output when the first piezoelectric element PZT1 alone is driven and the vibrational output when the second piezoelectric element PZT2 alone is driven as shown in FIGS. 11A and 11B is approximately equal to the magnitude of the vibrational output when both the first piezoelectric element PZT1 and the second piezoelectric element PZT2 are concurrently (e.g., simultaneously) driven as shown in FIG. 11C. Referring to FIG. 12, the magnitude of the vibration when the first piezoelectric element PZT1 alone is driven is represented with a dash single-dotted line 1200, the magnitude of the vibration when the second piezoelectric element PZT2 alone is driven is represented with a dash double-dotted line 1202, the magnitude of the sum of the vibrations generated when each of the first piezoelectric element PZT1 and the second piezoelectric element PZT2 are individually driven is represented with a dotted line 1204, and the magnitude of the sum of the vibrations generated when both the first piezoelectric element PZT1 and the second piezoelectric element PZT2 are concurrently (e.g., simultaneously) driven is represented with a solid line 1206.

When each of the first piezoelectric element PZT1 and the second piezoelectric element PZT2 is individually driven, the magnitude of the vibration transferred from the first piezoelectric element PZT1 may be about 1.2 G and the magnitude of the vibration transferred from the second piezoelectric element PZT2 may be about 0.6 G at a point of 2 cm from the center of the display panel 300 on the left. Therefore, the magnitude of the sum of the vibrations transferred from the first piezoelectric element PZT1 and the second piezoelectric element PZT2 may be about 1.8 G at a point 2 cm from the center of the display panel 300 on the left.

When both the first piezoelectric element PZT1 and the second piezoelectric element PZT2 are concurrently (e.g., simultaneously) driven, the magnitude of the vibration may be about 1.75 G at the point 2 cm from the center of the display panel 300 on the left. In other words, the magnitude of the sum of the vibrations generated when the plurality of piezoelectric elements are individually driven may be approximately equal to the magnitude of the vibration generated when the plurality of piezoelectric elements is driven at once.

As described above, the magnitude of the vibration of the piezoelectric element PZT may be determined in proportion to the applied voltage, and the magnitude of the vibration detected at a touched point may be equal to the magnitude of the sum of the vibrations transferred from the plurality of piezoelectric elements PZT. Below, a method of driving the display device to have a haptic effect, which is uniform throughout the entire area of the display panel 300 based on the features as described above, will be described in detail.

Figure 13:
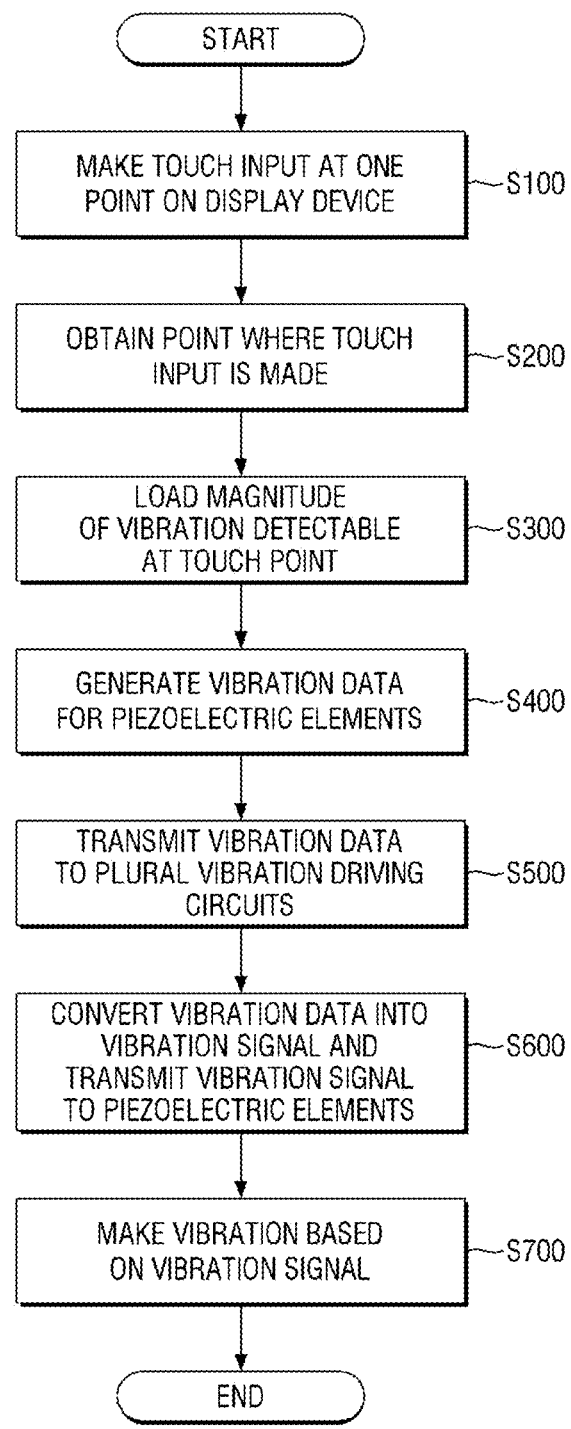
FIG. 13 is a flowchart showing a sequence of a method of driving a display device according to a first embodiment.
Figure 14:
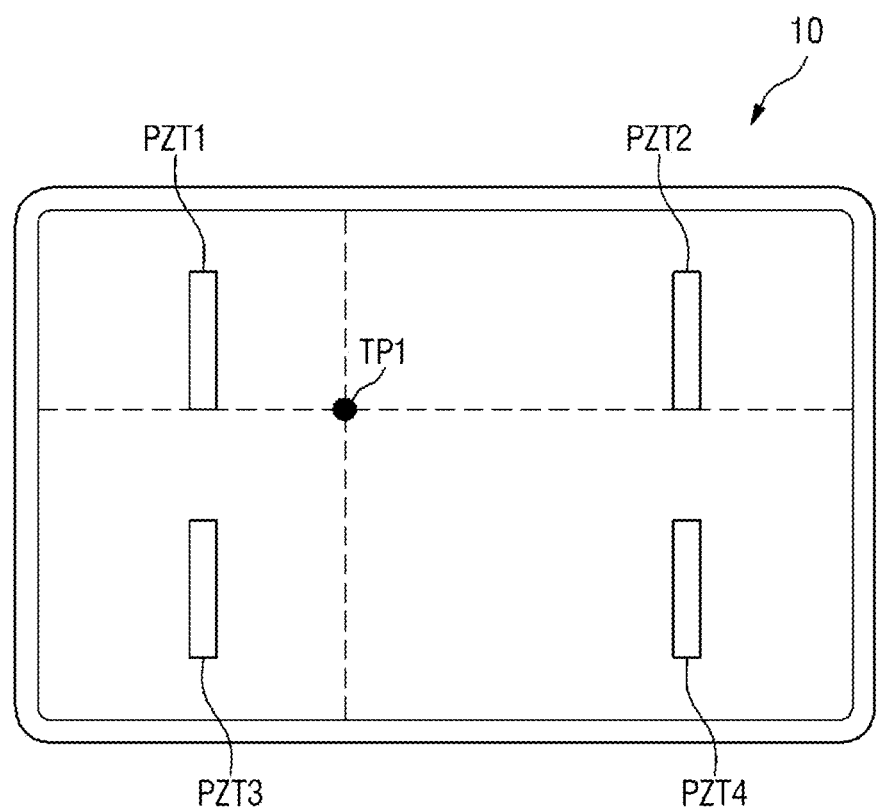
FIGS. 14 and 15 are views showing a case in which a touch is detected at one point of a display device in which piezoelectric elements are disposed.
Figure 15:
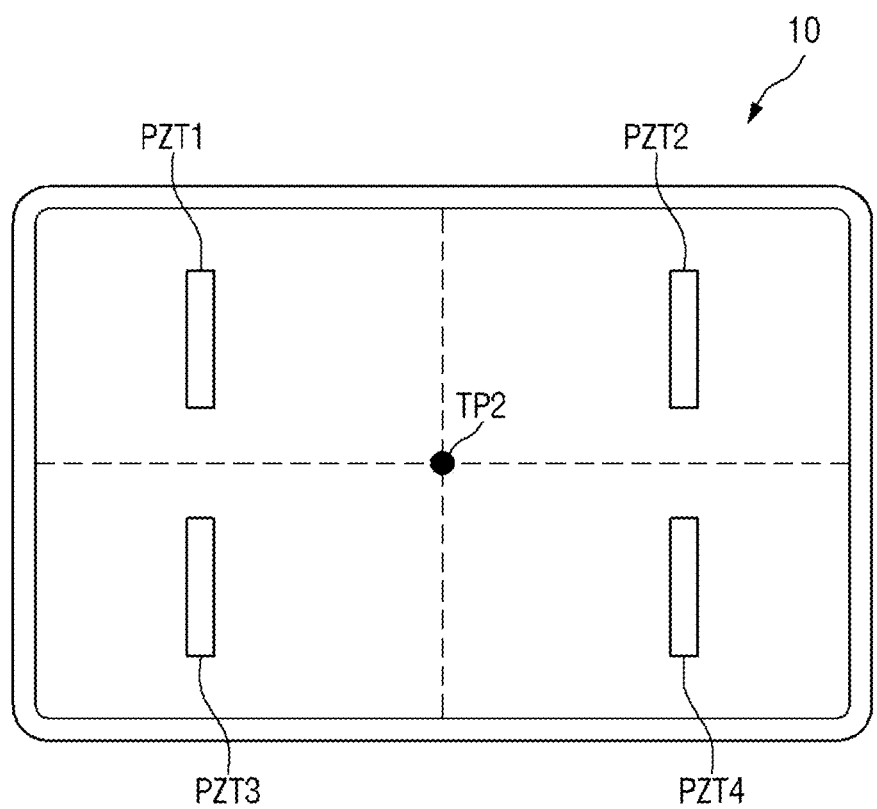
Figure 16:
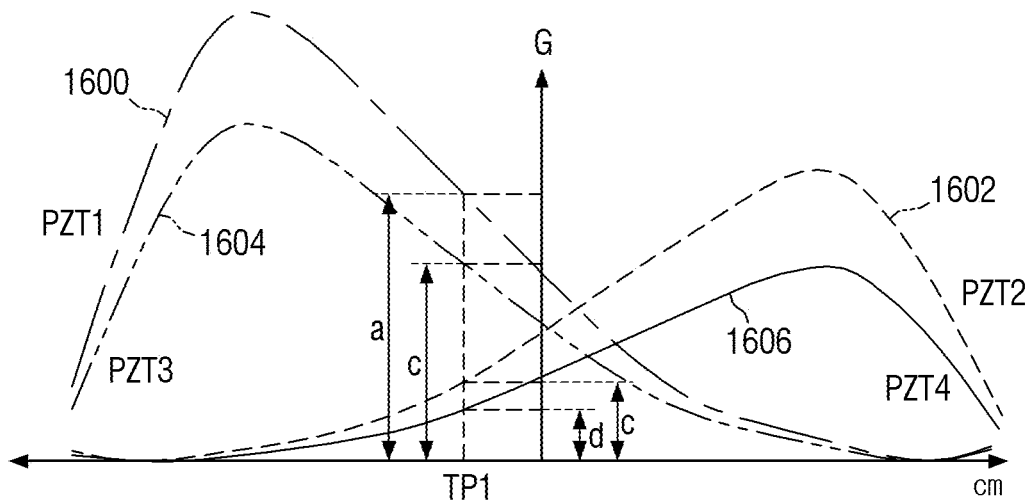
FIG. 16 is a graph showing magnitudes of vibration detected at touch points shown in FIG. 14 according to the piezoelectric elements.

FIG. 13 is a flowchart showing a sequence of a method of driving a display device according to a first embodiment. FIGS. 14 and 15 are views showing a case in which a touch is detected at one point of a display device in which piezoelectric elements are disposed. FIG. 16 is a graph showing magnitudes of vibration detected at touch points shown in FIG. 14 according to the piezoelectric elements. In FIG. 16, the magnitude of the vibration when the first piezoelectric element PZT1 alone is driven is represented with a dash single-dotted line 1600, the magnitude of the vibration when the second piezoelectric element PZT2 alone is driven is represented with a dashed line 1602, the magnitude of the vibration when the third piezoelectric element PZT3 alone is driven is represented with a dash double-dotted line 1604, and the magnitude of the vibration when the fourth piezoelectric element PZT4 alone is driven is represented with a solid line 1606.

Referring to FIGS. 5, 13, 14 and 16, a touch input may be made at one point on the display device 10 (S100). For example, a first touch input may be made at one point on an upper left portion of the display device 10.

The point where the touch input is made may be obtained (S200). For example, a first touch point TP1 where the first touch input is made may be obtained through the touch sensor 200. However, without limitations, the first touch point TP1 may be obtained through the pressure sensor SU of the piezoelectric element PZT. The first piezoelectric polymer layer 521 generates a sensing voltage proportional to pressure applied between the first electrode 511 and the second electrode 512 when the pressure is applied. The sensing voltages of the piezoelectric elements corresponding to the points on the display device 10 may be tabulated into a database as a lookup table in advance.

The main processor 710 loads the magnitudes of the vibrations, which are detectable at the touch point, in accordance with the driving voltages of the plurality of piezoelectric elements PZT (S300).

The database may be built in advance as the lookup table with the magnitudes of the vibrations detectable at a certain touch point of the display device 10. For example, referring to the following Table 1 and FIG. 16, voltages applied to the piezoelectric elements PZT, in order of level, are E>G>F>H. Therefore, vibrations detected at the first touch point TP1, in order of magnitude, are a>c>b>d.

TABLE 1

| Magnitudes of vibrations detected at first touch point (G) | Voltage levels of piezoelectric element (V) |
| --- | --- |
| P1  a | E |
| P2  b | F |
| P3  c | G |
| P4  d | H |

For example, the first touch point TP1 may receive a vibration having a magnitude of a from the first piezoelectric element PZT1, may receive a vibration having a magnitude of b from the second piezoelectric element PZT2, may receive a vibration having a magnitude of c from the third piezoelectric electrode PZT3, and may receive a vibration having a magnitude of d from the fourth piezoelectric element PZT4.

The main processor 710 generates vibration data according to the piezoelectric elements (S400).

The plurality of piezoelectric elements PZT may selectively operate. In other words, all of the piezoelectric elements PZT may not be required to operate to have the vibration haptic effect. Referring to FIG. 14, the first touch point TP1 is the closest to the first piezoelectric element PZT1. Therefore, when a desired magnitude X of a vibration is lower than the magnitude a of the vibration from the first piezoelectric element PZT1 detected at the first touch point TP1, only operating the first piezoelectric element PZT1 is enough to have a desired vibration effect. Here, the magnitude X of the vibration may be expressed in units of acceleration of gravity G. For example, the magnitude 2 G shows a vibration effect two times higher than that of the magnitude 1 G.

Referring to FIG. 15, a second touch point TP2 may be positioned at the same distance away from each of the plurality of piezoelectric elements PZT. In this case, unlike the first touch point TP1, one piezoelectric element PZT is not enough to make the vibration having the desired magnitude X. That is, when the desired magnitude X of the vibration is higher than a+c+b but lower than a+c+b+d, four piezoelectric elements PZT1, PZT2, PZT3, and PZT4 are all driven to have the desired vibration effect.

When the desired magnitude X of the vibration is higher than a+c+b+d, it is impossible to reach the desired vibration effect even when all the four piezoelectric elements PZT1, PZT2, PZT3, and PZT4 are driven. For example, when the magnitude a+b+c+d corresponding to the sum of the vibrations from all the piezoelectric elements PZT, detected at the touch point, is 2 G, it is impossible to make a vibration having a magnitude 3 G.

TABLE 2

| | 0 < X < a | a < X < a + c | a + < X < a + c + b | a + c + b < X < a + c + b + d | a + c + b + d < X |
| --- | --- | --- | --- | --- | --- |
| PZT1 | X/a*Vmax | Vmax | Vmax | Vmax | Not allowed |
| PZT2 | 0 | (X − a)/c*Vmax | Vmax | Vmax | |
| PZT3 | 0 | 0 | (X − (a + c)/b*Vmax | Vmax | |
| PZT4 | 0 | 0 | 0 | (X − (a + c + b)/d*Vmax | |

Taking a target magnitude X of vibration into account, the piezoelectric element PZT to be driven is selected, and then the main processor 710 generates vibration data for each of the piezoelectric elements to be driven. The vibration data may be a driving voltage level for each piezoelectric element. In proportion to the driving voltage, the magnitude of the vibration may be determined. For example, when the desired magnitude of the vibration at the first touch point TP1 is X, only the first piezoelectric element PZT1 is required to be driven, and a driving voltage for the first piezoelectric element PZT1 may be X/a*Vmax (V). That is, when a target magnitude of a vibration is 1 G and the magnitude of the vibration from the first piezoelectric element PZT1, detected at the first touch point, is 2 G, a driving voltage of 0.5 Vmax (V) is required for the first piezoelectric element PZT1.

Thus, driving only some of the plurality of piezoelectric elements PZT is enough to have a haptic effect, and therefore the target magnitude X of the vibration is achieved at the minimum level of the driving voltage.

The main processor 710 transmits the generated vibration data to each piezoelectric element driver 510 (S500). The piezoelectric element driver 510 converts the obtained vibration data into a vibration signal and transmits the vibration signal to each piezoelectric element PZT (S600). The piezoelectric element PZT generates a vibration based on the obtained vibration signal (S700).

The piezoelectric element driver 510 may generate a vibration signal in response to vibration data provided from the main processor 710 of the main circuit board 700. In this case, the vibration data of the main processor 710 may be provided to the piezoelectric element driver 510 via the main circuit board 700 and the vibration circuit board 500, and the vibration signal generated in the piezoelectric element driver 510 may be transmitted to the piezoelectric element PZT via the vibration circuit board 500.

The piezoelectric element driver 510 may include the DSP to process the digital signal, that is, the vibration data; the DAC to convert the digital signal processed by the digital signal processor, that is, the vibration data into an analog signal, that is, a vibration signal; and the AMP to amplify and output the analog signal converted by the DAC, that is, the vibration signal.

As described above, only some piezoelectric elements PZT among the plurality of piezoelectric elements PZT are enough to achieve the target magnitude of the vibration. In this case, a method of using other piezoelectric elements PZT which are not driven will be described below in detail with reference to FIGS. 17 and 18A to 18C.

Figure 17:
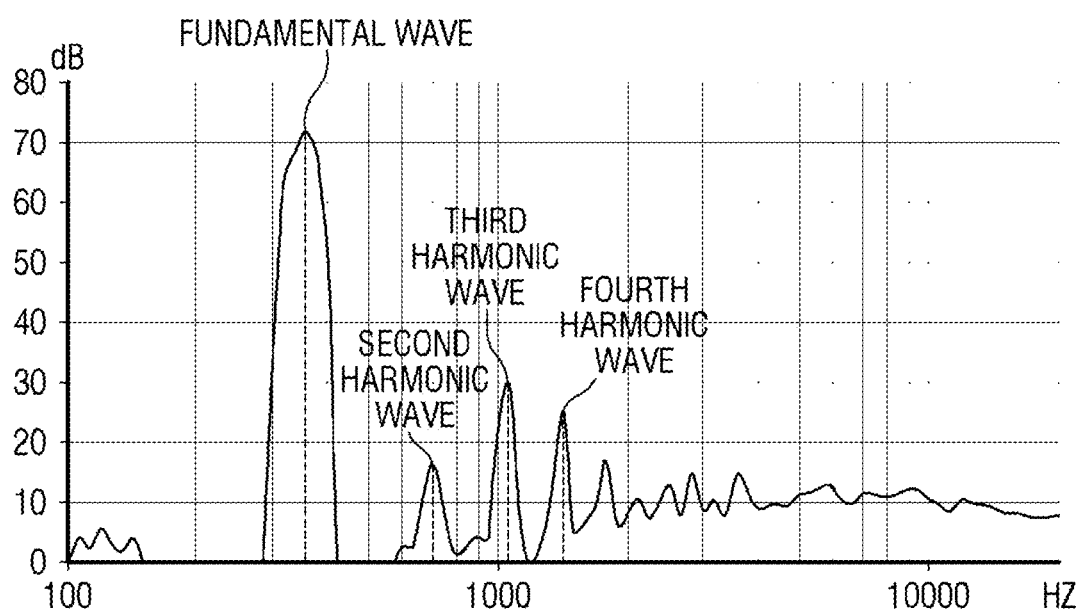
FIG. 17 is a graph showing noise generated with vibration when the vibration is generated in a display device.

FIG. 17 is a graph showing noise generated with vibration when the vibration is generated in a display device.

Referring to FIGS. 14 and 17, when only the first piezoelectric element PZT1 and the third piezoelectric electrode PZT3 are driven to have a tactile haptic effect, the second piezoelectric element PZT2 and the fourth piezoelectric element PZT4 may be used in implementing a noise canceling function.

As shown in FIG. 17, a fundamental wave caused by driving the first piezoelectric element PZT1 and the third piezoelectric electrode PZT3 may have a level of about 70 dB at about 500 Hz. In other words, a vibration may be generated having a magnitude of 70 dB. Second to fourth harmonic wave components may also be generated along with the fundamental wave. The highest harmonic, that is, the third harmonic wave may be lower than the fundamental wave by about 40 dB. The second harmonic wave to the fourth harmonic wave may correspond to a noise component. That is, when a vibration is made corresponding to a touch input, noise may be made unintentionally. The second harmonic wave to the fourth harmonic wave is a relatively high frequency wave as compared with the fundamental wave and are thus more audible to human's ears. A method of cancelling the noise component, that is, the second to fourth harmonic waves will be described below with reference to FIG. 18A to 18C.

Figure 18A:
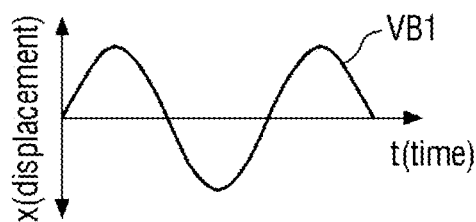
FIGS. 18A-18C are graphs showing a first vibration based on a noise component, a second vibration based on a noise canceling component, and a third vibration based on canceled noise.
Figure 18B:
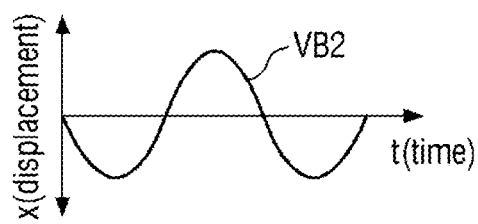
Figure 18C:
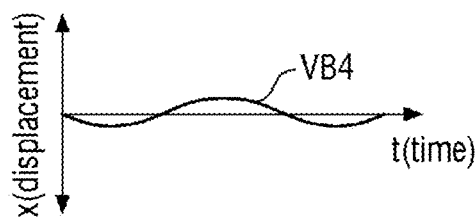

FIGS. 18A to 18C are graphs showing a first vibration based on a noise component, a second vibration based on a noise canceling component, and a third vibration based on canceled noise. In the graphs of FIGS. 18A to 18C, the abscissa denotes time, and the ordinate denotes displacement based on vibration.

In FIG. 18A, a curve VB1 indicates a first vibration of a noise component generated by the first and third piezoelectric elements PZT1 and PZT3 according to the embodiment. As described above, the first and third piezoelectric elements PZT1 and PZT3 may be attached to one surface of the panel bottom member 400 and may vibrate the display panel 300. However, the first vibration, excluding the vibration of the display panel 300 to actualize the tactile haptics, may make noise, and therefore, it is desirable to remove or substantially reduce the first vibration. Thus, the second and fourth piezoelectric elements PZT2 and PZT4 may vibrate in an inverse direction to that of the first vibration of the noise component generated from the first and third piezoelectric elements PZT1 and PZT3, thereby canceling the vibration that makes noise.

In FIG. 18B, a curve VB2 indicates a second vibration generated by the second and fourth piezoelectric elements PZT2 and PZT4. As described above, to cancel the first vibration of the noise component generated by the first and third piezoelectric elements PZT1 and PZT3, the second and fourth piezoelectric elements PZT2 and PZT4 may vibrate inversely to the first and third piezoelectric elements PZT1 and PZT3.

Referring to FIG. 18C, the curves VB1 and VB2 cancel each other out because their phases are the inverse of one other. A curve VB3 obtained by combining the curve VB1 and the curve VB2 may show that the magnitude of the vibration becomes zero or decreases. Thus, it is possible to effectively remove or substantially reduce the vibration, which may make noise, excluding the vibration of the display panel 300 for actualizing the tactile haptics.

Below, other embodiments will be described. In the following embodiments, descriptions about the same elements as those of the embodiments that have already been described may be omitted or simplified, and differences will be further described.

Figure 19:
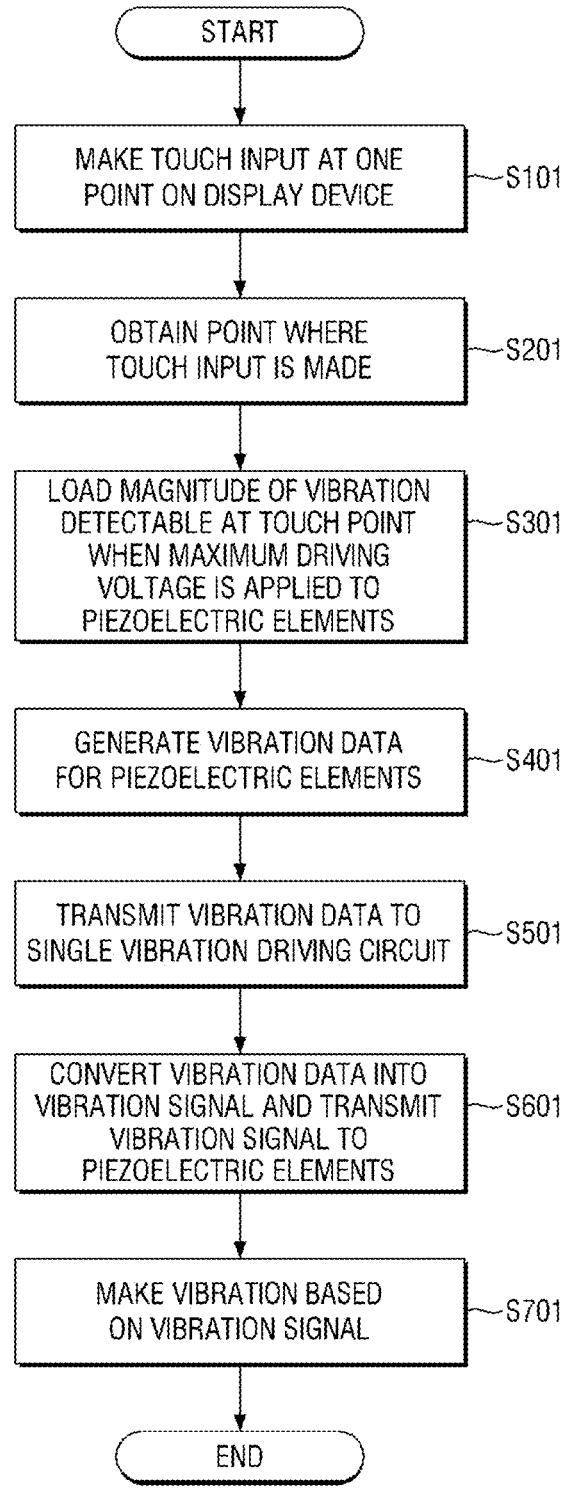
FIG. 19 is a flowchart showing a sequence of a method of driving a display device according to a second embodiment.
Figure 20:
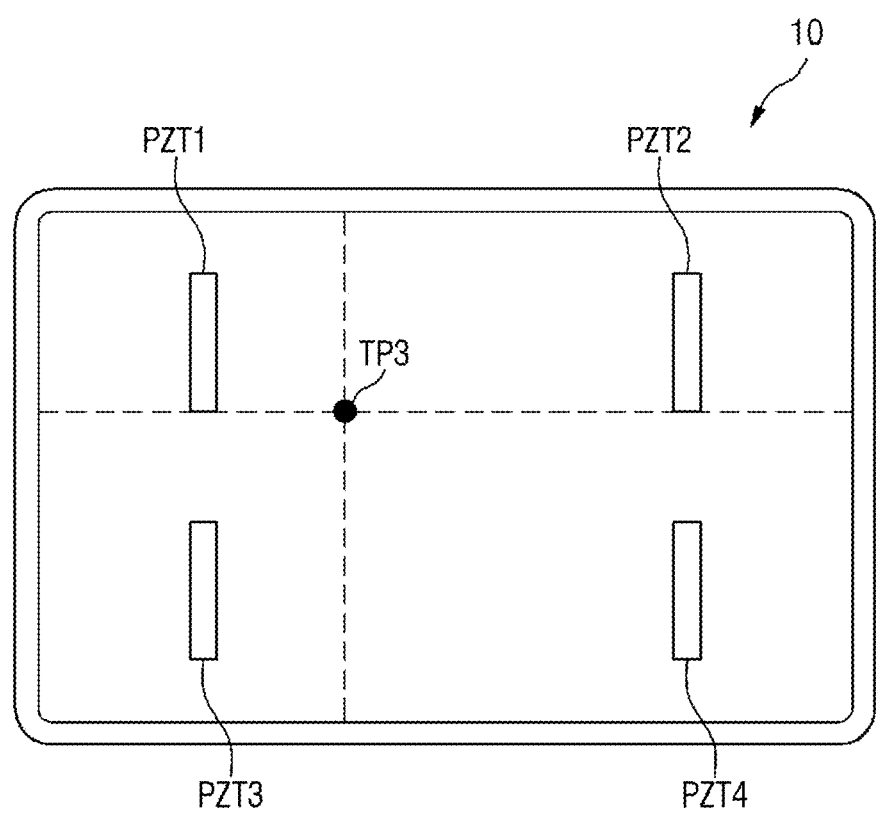
FIGS. 20-21 are views showing a case in which a touch is detected at one point of a display device in which piezoelectric elements are disposed.
Figure 21:
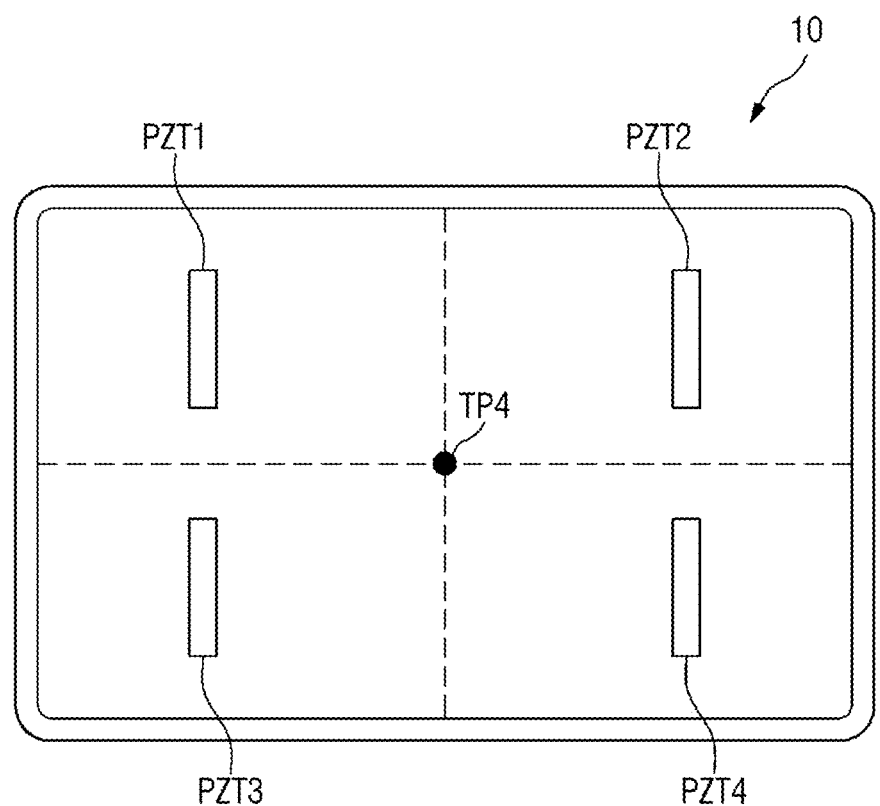

FIG. 19 is a flowchart showing a sequence of a method of driving a display device according to a second embodiment. FIGS. 20 and 21 are views showing a case in which a touch is detected at one point of a display device in which piezoelectric elements are disposed.

Referring to FIGS. 5 and 19 to 21, a touch input may be made at one point on the display device 10 (S101). For example, a third touch input may be made at one point on the upper left portion of the display device 10.

A point where the touch input is made may be obtained (S201). For example, a third touch point TP3 where the third touch input is made may be obtained through the touch sensor 200. However, without limitations, the third touch point TP3 may be obtained through the pressure sensor SU of the piezoelectric element PZT. The first piezoelectric polymer layer 521 generates a sensing voltage proportional to pressure applied between the first electrode 511 and the second electrode 512 when the pressure is applied. The sensing voltages of the piezoelectric elements corresponding to the points on the display device 10 may be tabulated into a database as a lookup table in advance.

The main processor 710 loads the magnitudes of the vibrations, which are detectable at the touch point, when the highest driving voltage is applied to each of the piezoelectric element PZT (S301).

The database may be built, in advance, as the lookup table with the magnitudes of the vibrations detectable at a certain touch point of the display device 10 when the highest voltage is applied to each of the piezoelectric elements PZT. For example, referring to the following Table 3, the magnitude of the vibration detected at the third touch point TP3 may be a+b+c+d, and the vibrations detected at the third touch point TP3, in order of magnitude, may be a>c>b>d. Referring to the following Table 4, the magnitude of the vibration detected at the fourth touch point TP4 may be a'+b'+c'+d', and the magnitudes of the vibrations detected at the fourth touch point TP4 may be a'=b'=c'=d'. The magnitude a+b+c+d of the vibration detected at the third touch point TP3 may be different from the magnitude a'+b'+c'+d' of the vibration detected at the fourth touch point TP4. However, without limitations, the vibrations detected at certain touch points may have the same magnitude.

TABLE 3

| | Magnitudes of vibrations detected at third touch point (G) | Voltage levels of piezoelectric element (V) |
|---|---|---|
| PZT1 | a | I |
| PZT2 | b | I |
| PZT3 | c | I |
| PZT4 | d | I |

TABLE 4

| | Magnitudes of vibrations detected at fourth touch point (G) | Voltage levels of piezoelectric element (V) |
|---|---|---|
| PZT1 | a' | I' |
| PZT2 | b' | I' |
| PZT3 | c' | I' |
| PZT4 | d' | I' |

For example, the third touch point TP3 may receive a vibration having a magnitude of 'a' from the first piezoelectric element PZT1, may receive a vibration having a magnitude of 'b' from the second piezoelectric element PZT2, may receive a vibration having a magnitude of 'c' from the third piezoelectric electrode PZT3, and may receive a vibration having a magnitude of 'd' from the fourth piezoelectric element PZT4. The fourth touch point TP4 may receive a vibration having a magnitude of a' from the first piezoelectric element PZT1, may receive a vibration having a magnitude of b' from the second piezoelectric element PZT2, may receive a vibration having a magnitude of c' from the third piezoelectric electrode PZT3, and may receive a vibration having a magnitude of d' from the fourth piezoelectric element PZT4.

The main processor 710 generates vibration data for the piezoelectric elements (S400).

The plurality of piezoelectric elements PZT may operate concurrently (e.g., simultaneously). In other words, all of the piezoelectric elements PZT may concurrently (e.g., simultaneously) operate with one driving voltage.

Referring to FIG. 20, the magnitude of the vibration detected at the third touch point TP3 may be a+b+c+d. In this case, when the desired magnitude of the vibration is X, all the driving voltages for the piezoelectric elements PZT may be X/(a+b+c+d)*Vmax (V). For example, when the magnitude of the vibration detected at the third touch point TP3 is 2 G and the desired magnitude of the vibration is 1 G, the driving voltage I for the piezoelectric elements PZT may be 0.5 Vmax (V).

Referring to FIG. 21, the magnitude of the vibration detected at the fourth touch point TP4 may be a'+b'+c'+d'. In this case, when the desired magnitude of the vibration is X', all the driving voltages for the piezoelectric elements PZT may be X'/(a'+b'+c'+d')*Vmax (V). For example, when the magnitude of the vibration detected at the fourth touch point TP4 is 4 G and the desired magnitude of the vibration is 1 G, the driving voltage I' for the piezoelectric elements PZT may be 0.25 Vmax (V).

Taking the target magnitude of the vibration X into account, the main processor 710 generates vibration data to be equally applied to all the piezoelectric elements PZT. The vibration data may be a driving voltage level for the piezoelectric element.

Thus, one driving voltage level is applied to all the piezoelectric elements PZT, and thus a plurality of piezoelectric element drivers may not be required. Therefore, a single piezoelectric element driver 510 is enough to achieve the target magnitude X of the vibration, and thus it is easy to make a circuit.

The main processor 710 transmits the generated vibration data to the single piezoelectric element driver 510 (S501). The single piezoelectric element driver 510 converts the obtained vibration data into the vibration signal and transmits the vibration signal to all of the piezoelectric elements PZT (S601). The piezoelectric element PZT generates vibration based on the obtained vibration signal (S701).

The piezoelectric element driver 510 may generate the vibration signal in response to the vibration data provided from the main processor 710 of the main circuit board 700. In this case, the vibration data of the main processor 710 may be provided to the piezoelectric element driver 510 via the main circuit board 700 and the vibration circuit board 500, and the vibration signal generated in the piezoelectric element driver 510 may be transmitted to the piezoelectric element PZT via the vibration circuit board 500.

The piezoelectric element driver 510 may include the DSP to process the digital signal, that is, the vibration data; the DAC to convert the digital signal processed by the digital signal processor, that is, to convert the vibration data into an analog signal, which is a vibration signal; and the AMP to amplify and output the analog signal converted by the DAC, that is, the vibration signal.

As described above, according to the second embodiment, the single piezoelectric element driver 510 is used to apply one driving voltage level to the plurality of piezoelectric elements PZT, thereby achieving a desired magnitude of vibration. However, when the number, position, and size of piezoelectric elements PZT are set differently from those of the second embodiment where a driving voltage level is calculated according to touch points, the magnitudes of the vibration may be the same throughout all positions of the display device 10 according to an input driving voltage.

Figure 22:
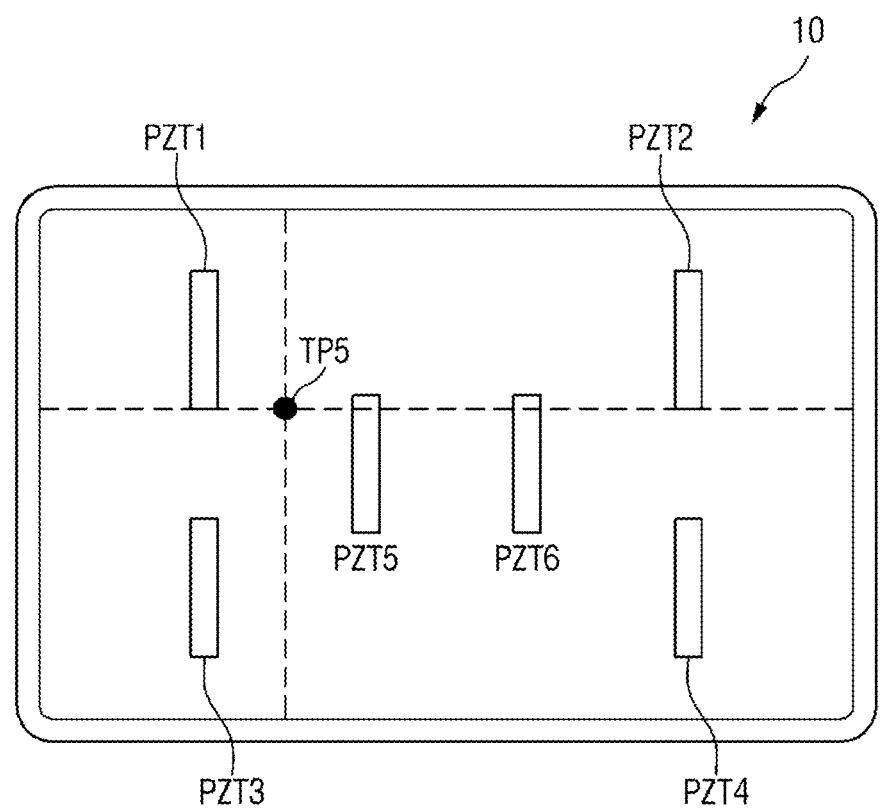
FIG. 22 is a view showing piezoelectric elements disposed on a display device.

FIG. 22 is a view showing piezoelectric elements disposed on a display device.

Referring to FIG. 22, when the structure of the display device 10 is taken into account, a user is likely to perceive vibration more easily from a center area than an edge area of the display area DA100. Therefore, magnitudes of vibrations generated in fifth and sixth piezoelectric elements PZT5 and PZT6 disposed in the center area of the display device 10 may be designed to be lower than those generated in the first to fourth piezoelectric elements PZT1, PZT2, PZT3 and PZT4 disposed in the edge area of the display device 10. Referring to the following Table 5, when one driving voltage level of J (V) is supplied to all the piezoelectric element PZT, the vibrations detected at all of the touch points of the display device 10 have the same magnitude of a (G).

TABLE 5

| | Magnitudes of vibrations detected at certain touch point (G) | Voltage levels of piezoelectric element (V) |
|---|---|---|
| PZT1 | a | J |
| PZT2 | a | J |
| PZT3 | a | J |
| PZT4 | a | J |
| PZT5 | a | J |
| PZT6 | a | J |

With the display device and the method of driving the same according to the embodiment, the touch sensing and the haptic feedback function are integrated to thereby slim the display device.

Further, with the display device and the method of driving the same according to the embodiment, the haptic feedback of the same strength is provided throughout the entire area of the display device, thereby making the display device reliable.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Although certain exemplary embodiments have been described herein, other embodiments and modifications will be apparent from this description. Accordingly, the inventive concepts are not limited to such embodiments, but rather to the scope of the appended claims and equivalents thereof.

What is claimed is:

1. A display device comprising:
   a display panel; and
   a plurality of piezoelectric elements arranged on one surface of the display panel,
   wherein each of the plurality of piezoelectric elements comprises:
      a pressure sensor configured to detect pressure applied to a surface opposite to the one surface of the display panel, the pressure sensor comprising a first electrode, a second electrode, and a first piezoelectric polymer layer between the first electrode and the second electrode; and a haptic device configured to generate vibration according to a driving voltage, the haptic device comprising a third electrode, a fourth electrode, and a second piezoelectric polymer layer between the third electrode and the fourth electrode, wherein the first electrode comprises first branch electrodes, the third electrode comprises third branch electrodes, and a number of the first branch electrodes is less than a number of the third branch electrodes.

2. The display device of claim 1, wherein the pressure sensor is on the one surface of the display panel, and wherein the haptic device is on the pressure sensor.

3. The display device of claim 1, wherein the pressure sensor is thinner than the haptic device.

4. The display device of claim 1, wherein:

the first electrode further comprises a first stem electrode, the first branch electrodes being branched out from the first stem electrode; and the second electrode comprises a second stem electrode and second branch electrodes branched out from the second stem electrode.

5. The display device of claim 4, wherein the first branch electrodes and the second branch electrodes are arranged in parallel and alternately arranged in a direction.

6. The display device of claim 4, wherein:

the third electrode further comprises a third stem electrode, the third branch electrodes being branched out from the third stem electrode; and the fourth electrode comprises a fourth stem electrode and fourth branch electrodes branched out from the fourth stem electrode.

7. The display device of claim 6, wherein a number of the second branch electrodes is less than a number of the third branch electrodes or a number of the fourth branch electrodes.

8. The display device of claim 1, further comprising a plurality of piezoelectric element drivers configured to detect voltages generated in the first and second electrodes of the pressure sensor according to the pressure applied to the surface opposite to the one surface of the display panel.

9. The display device of claim 8, wherein the plurality of piezoelectric element drivers are configured to apply the driving voltage to the third and fourth electrodes of the haptic device to make the haptic device vibrate.

10. The display device of claim 8, further comprising a main processor configured to obtain a plurality of sensing voltages detected by the first and second electrodes of the pressure sensors from the plurality of piezoelectric element drivers, to identify a piezoelectric element to be driven among the plurality of piezoelectric elements based on a comparison between the plurality of sensing voltages and a driving voltage for haptic-target vibration, and to identify the driving voltage for each of the piezoelectric elements to be driven.

11. The display device of claim 10, wherein the main processor is configured to:

compare a magnitude of vibration from a first piezoelectric element having a highest sensing voltage among the plurality of piezoelectric elements with a magnitude of the haptic-target vibration and identify the first piezoelectric element as the piezoelectric element to be driven when the magnitude of the haptic-target vibration is lower than the magnitude of the vibration from the first piezoelectric element;

compare a magnitude of a sum of vibration from a second piezoelectric element having a next highest sensing voltage after the highest sensing voltage of the first piezoelectric element among the plurality of piezoelectric elements and the vibration from the first piezoelectric element with the magnitude of the haptic-target vibration when the magnitude of the vibration from the first piezoelectric element is lower than the magnitude of the haptic-target vibration; and identify the first piezoelectric element and the second piezoelectric element as the piezoelectric elements to be driven when the magnitude of the haptic-target vibration is lower than the magnitude of the sum of the vibration from the first piezoelectric element and the vibration from the second piezoelectric element.

12. The display device of claim 11, wherein the main processor is configured to:

when only the first piezoelectric element is driven, identify the driving voltage for the first piezoelectric element based on a first value resulting from multiplying a second value by a maximum driving voltage for the plurality of piezoelectric elements, the second value being a result of dividing the magnitude of the haptic-target vibration by the magnitude of the vibration from the first piezoelectric element; and when the first piezoelectric element and the second piezoelectric element are driven, identify the maximum driving voltage as the driving voltage for the first piezoelectric element and identify a third value, resulting from multiplying a fourth value by the maximum driving voltage for the piezoelectric element, as the driving voltage for the second piezoelectric element, the fourth value being a result of dividing a fifth value by the magnitude of the vibration from the second piezoelectric element, the fifth value being a result of subtracting the magnitude of the vibration from the first piezoelectric element from the magnitude of the haptic-target vibration.

13. A method of driving a display device, the method comprising:

obtaining sensing voltages from a plurality of piezoelectric elements;

detecting a touch point based on the sensing voltages;

loading a magnitude of vibration from each of the plurality of piezoelectric elements, the magnitude of the vibration from each of the plurality of piezoelectric elements being detectable at the touch point;

comparing a magnitude of haptic-target vibration with the magnitude of the vibration from each of the plurality of piezoelectric elements;

identifying a piezoelectric element to be driven among the plurality of piezoelectric elements based on a comparison between the sensing voltages and a driving voltage for the haptic-target vibration, and identifying a driving voltage for the piezoelectric element to be driven; and generating the haptic-target vibration based on the driving voltage.

14. The method of claim 13, wherein the identifying of a piezoelectric element to be driven among the plurality of piezoelectric elements comprises:

comparing a magnitude of vibration from a first piezoelectric element having a highest sensing voltage among the plurality of piezoelectric elements with a magnitude of the haptic-target vibration and identifying the first piezoelectric element as the piezoelectric element to be driven when the magnitude of the haptic-target vibration is lower than the magnitude of the vibration from the first piezoelectric element;

comparing a magnitude of a sum of vibration from a second piezoelectric element having a next highest sensing voltage after the sensing voltage of the first piezoelectric element among the plurality of piezoelectric elements and the vibration from the first piezoelectric element with the magnitude of the haptic-target vibration when the magnitude of the vibration from the first piezoelectric element is lower than the magnitude of the haptic-target vibration; and identifying the first piezoelectric element and the second piezoelectric element as the piezoelectric elements to be driven when the magnitude of the haptic-target vibration is lower than the magnitude of the sum of the vibration from the first piezoelectric element and the vibration from the second piezoelectric element.

15. The method of claim 14, wherein the identifying of a driving voltage for each piezoelectric element to be driven comprises:

when only the first piezoelectric element is driven, identifying the driving voltage for the first piezoelectric element based on a first value resulting from multiplying a second value by a maximum driving voltage for the plurality of piezoelectric elements, the second value being a result of dividing the magnitude of the haptic-target vibration by the magnitude of the vibration from the first piezoelectric element; and when the first piezoelectric element and the second piezoelectric element are driven, identifying the maximum driving voltage as the driving voltage for the first piezoelectric element and identifying a third value resulting from multiplying a fourth value by the maximum driving voltage for the piezoelectric element as the driving voltage for the second piezoelectric element, the fourth value being a result of dividing a fifth value by the magnitude of the vibration from the second piezoelectric element, the fifth value being a result of subtracting the magnitude of the vibration from the first piezoelectric element from the magnitude of the haptic-target vibration.

16. The method of claim 13, further comprising removing noise caused by the haptic-target vibration.

17. The method of claim 16, wherein the removing of the noise caused by the haptic-target vibration comprises making a first piezoelectric element that is not driven among the plurality of piezoelectric elements generate a second vibration having an inverse phase to a first vibration of a noise component generated by a second piezoelectric element that is driven among the plurality of piezoelectric elements.

18. A method of driving a display device, the method comprising:

obtaining sensing voltages from a plurality of piezoelectric elements;

detecting a touch point based on the sensing voltages;

loading a magnitude of vibration from each of the plurality of piezoelectric elements detectable at the touch point when a highest driving voltage is applied to the plurality of piezoelectric elements;

identifying a driving voltage for the plurality of piezoelectric elements based on the magnitude of a sum of vibration from each the plurality of piezoelectric elements and the highest driving voltage; and generating a haptic-target vibration based on the driving voltage.

19. The method of claim 18, wherein the identifying of the driving voltage for the plurality of piezoelectric elements comprises identifying the driving voltage based on a first value obtained by multiplying a second value by the highest driving voltage, the second value being a result of dividing the haptic-target vibration by a magnitude of a sum of vibration from the plurality of piezoelectric elements detectable at the touch point when a maximum driving voltage is applied to the plurality of piezoelectric elements.

* * * * *